United States Patent [19]
Sherman et al.

[11] Patent Number: 5,847,280
[45] Date of Patent: *Dec. 8, 1998

[54] MONOLITHIC MICROMECHANICAL APPARATUS WITH SUSPENDED MICROSTRUCTURE

[75] Inventors: Steven J. Sherman, Lexington; Robert W. K. Tsang, Bedford; Theresa A. Core, North Andover; A. Paul Brokaw, Burlington, all of Mass.

[73] Assignee: Analog Devices, Inc., Norwood, Mass.

[ * ] Notice: The term of this patent shall not extend beyond the expiration date of Pat. Nos. 5,345,824 and 5,417,111.

[21] Appl. No.: 448,181

[22] Filed: May 23, 1995

Related U.S. Application Data

[60] Continuation of Ser. No. 75,043, Jun. 10, 1993, Pat. No. 5,417,111, which is a division of Ser. No. 899,765, Jun. 17, 1992, abandoned, which is a continuation-in-part of Ser. No. 569,080, Aug. 17, 1990, abandoned, and Ser. No. 872,037, Apr. 22, 1992, Pat. No. 5,314,572, which is a continuation-in-part of Ser. No. 569,080, Aug. 17, 1990, abandoned.

[51] Int. Cl.$^6$ .................................................. G01P 15/125
[52] U.S. Cl. ........................................ 73/514.32; 361/280
[58] Field of Search ......................... 73/514.18, 514.24, 73/514.32, 514.38; 361/280, 283.1, 283.3

[56] References Cited

U.S. PATENT DOCUMENTS

| | | | |
|---|---|---|---|
| 3,877,313 | 4/1975 | Ferriss | 73/516 R |
| 4,094,199 | 6/1978 | Holdren et al. | 73/517 B |
| 4,342,227 | 8/1982 | Peterson et al. | 73/510 |
| 4,443,932 | 4/1984 | Mastroianni et al. | 29/576 W |
| 4,483,194 | 11/1984 | Rudolf | 73/517 R |
| 4,600,934 | 7/1986 | Aine et al. | 357/26 |
| 4,653,326 | 3/1987 | Danel et al. | 73/517 R |
| 4,663,972 | 5/1987 | Gerard | 73/517 R |
| 4,670,092 | 6/1987 | Motamedi | 156/643 |
| 4,674,319 | 6/1987 | Muller et al. | 73/23 |

(List continued on next page.)

FOREIGN PATENT DOCUMENTS

| | | |
|---|---|---|
| 0198724 | 10/1986 | European Pat. Off. . |
| 0 274 201 | 7/1988 | European Pat. Off. . |
| 0299825 | 1/1989 | European Pat. Off. . |
| 0369352 | 5/1990 | European Pat. Off. . |
| 40 19821A1 | 1/1991 | Germany . |
| WO92/03740 | 5/1992 | WIPO . |

OTHER PUBLICATIONS

Kenny, T.W. et al Micromachined Silicon Tunnel Sensor for Motion Detection, Appl. Phys. Lett. 58(1) pp. 100–102, Jan. 1991.

Greenwood, J. "Silicon Based Sensors: Technology Overview", Instrument Sci. & Tech. Group of Physics London 1986.

Van Paemel, M., "Interface Circuit for Capacitive Accelerometer" Sensors and Actuators, vol. 17, Nos. 3 and 4, (1989) ISSN 0250–6874, pp. 629–637.

(List continued on next page.)

*Primary Examiner*—John E. Chapman
*Attorney, Agent, or Firm*—Wolf, Greenfield & Sacks, P.C.

[57] ABSTRACT

A monolithic capacitance-type microstructure includes a semiconductor substrate, a plurality of posts extending from the surface of the substrate, a bridge suspended from the posts, and an electrically-conductive, substantially stationary element anchored to the substrate. The bridge includes an element that is laterally movable with respect to the surface of the substrate. The substantially stationary element is positioned relative to the laterally movable element such that the laterally movable element and the substantially stationary element form a capacitor. Circuitry may be disposed on the substrate and operationally coupled to the movable element and the substantially stationary element for processing a signal based on a relative positioning of the movable element and the substantially stationary element. A method for fabricating the microstructure and the circuitry is disclosed.

8 Claims, 18 Drawing Sheets

U.S. PATENT DOCUMENTS

| | | | |
|---|---|---|---|
| 4,679,434 | 7/1987 | Stewart | 73/517 B |
| 4,705,659 | 11/1987 | Bernstein et al. | 264/29.6 |
| 4,711,128 | 12/1987 | Boura | 73/517 B |
| 4,736,629 | 4/1988 | Cole | 73/517 R |
| 4,804,875 | 2/1989 | Albert | 310/323 |
| 4,851,080 | 7/1989 | Howe et al. | 156/647 |
| 4,873,868 | 10/1989 | Pierre et al. | 73/517 R |
| 4,879,914 | 11/1989 | Norling | 73/862.59 |
| 4,882,933 | 11/1989 | Peterson et al. | 73/517 R |
| 4,891,255 | 1/1990 | Ciarlo | 428/131 |
| 4,891,984 | 1/1990 | Fujii et al. | 73/517 R |
| 4,893,509 | 1/1990 | MacIver et al. | 73/517 AV |
| 4,918,032 | 4/1990 | Jain et al. | 437/228 |
| 4,920,801 | 5/1990 | Church | 73/517 R |
| 4,922,756 | 5/1990 | Henrion | 73/517 R |
| 4,928,203 | 5/1990 | Swindal et al. | 361/280 |
| 4,930,042 | 5/1990 | Wiegand et al. | 361/280 |
| 4,930,043 | 5/1990 | Wiegand | 361/283 |
| 4,945,765 | 8/1990 | Roszhart | 73/517 AV |
| 4,977,101 | 12/1990 | Yoder et al. | 437/51 |
| 4,997,521 | 3/1991 | Howe et al. | 156/651 |
| 5,005,413 | 4/1991 | Novack et al. | 73/517 AV |
| 5,008,774 | 4/1991 | Bullis et al. | 361/283 |
| 5,013,693 | 5/1991 | Guckel et al. | 437/248 |
| 5,025,346 | 6/1991 | Tang et al. | 361/283 |
| 5,054,320 | 10/1991 | Yvon | 73/517 B |
| 5,059,556 | 10/1991 | Wilcoxen | 437/200 |
| 5,060,039 | 10/1991 | Weinberg et al. | 357/26 |
| 5,060,504 | 10/1991 | White et al. | 73/1 D |
| 5,103,667 | 4/1992 | Allen et al. | 73/1 D |
| 5,163,325 | 11/1992 | White et al. | 73/517 R |
| 5,253,510 | 10/1993 | Allen et al. | 73/1 D |
| 5,337,606 | 8/1994 | Bennett et al. | 73/517 R |
| 5,445,006 | 8/1995 | Allen et al. | 73/1 D |

OTHER PUBLICATIONS

Howe, R.T et al, "Silicon Micromechanics: Sensors and Actuators on a Chip", IEEE, Spectrum, Jul. 1990, pp. 29–35.

Kim, E.S. et al, "Improved IC Compatible Piezoelectric Microphone and CMOS Process", IEEE, May 1991, pp. 270–273.

Lee, M.K. et al, "A Bipolar Integrated Silicon Pressure Sensor", IEEE, May 1991, pp. 300–303.

Putty, M.W. et al, "Process Integration for Active Polysilicon Resonant Microstructures", Sensors and Actuators, 20 (1989), pp. 143–151.

Bernstein, J. et al, "Carbon Film Oxidation—Undercut Kinetics", J. Electrochem. Soc.: Solid State Science & Technology, Aug. 1988, pp. 2086–2090.

Guckel, H. et al The Application of Fine–Grained, Tensile Polysilicon to Mechanically Resonant Sensors and Actuators, A21–A23, (1990), pp. 346–351.

Knockeart, R.P. et al, "Integrated Micromachined Silicon: Vehicle Sensors of the 1990's?", IEEE Proc. on the Inter Congress on Trans., Oct. 1988, pp. 203–212.

Morris, H.M. "Microsensors Enhance Process Variable Transmitters' Abilities", Control Engineering vol. 38, No. 13, Oct. 1991, pp. 122–125.

Payne R.S. et al, "Surface Micromachined Accelerometer: A Technology Update", SAE International Int'l. Congress Exposition, Detroit, MI, Feb. 25–Mar. 1, 1991, pp. 127–135.

Lober T.A. et al, "Surface Micromachining Processes for Electrostatic Microactuator Fabrication", IEEE, 1993, pp. 59–62.

Mastrangelo, C.H. "A Dry–Release Method Based on Polymer Columns for Microstructure Fabrication", IEEE, 1993, pp. 77–81.

Stix, G., "Micron Machinations", Trends in Micromechanics, Scientific American, Nov. 1992, pp. 106–117.

Core, T. et al, "Integrated, Complete, Affordable Accelerometer for Airbag Applications", Sensors Expo Proceedings, 1991, pp. 204B-1 – 204B-4.

Goodenough, F., "Airbags Boom When IC Accelerometer Sees 50G", Electronic Design, Aug. 8, 1991.

Howe, R.T., Integrated Silicon Electromechanical Sensor, vol. 46/04–B of Dissertation Abstracts International, 1984.

Tang, William C. et al, "Laterally Driven Polysilicon Resonant Microstructures", Sensors and Actuators, 20 (1989) pp. 25–32.

MONOLITHIC MICROMECHANICAL APPARATUS WITH SUSPENDED MICROSTRUCTURE

CROSS REFERENCE TO RELATED APPLICATIONS

This application is a continuation of application Ser. No. 08/075,043 filed Jun. 10, 1993, U.S. Pat. No. 5,417,111, which is a division of application Ser. No. 07/899,765 filed Jun. 17, 1992, abandoned, which is a continuation-in-part of application Ser. No. 07/569,080 filed Aug. 17, 1990, abandoned, and a continuation-in-part of application Ser. No. 07/872,037 filed Apr. 22, 1992, U.S. Pat. No. 5,314,572, which is a continuation-in-part of application Ser. No. 07/569,080 filed Aug. 17, 1990, now abandoned.

FIELD OF THE INVENTION

This invention relates to monolithic micromechanical devices and, more particularly, to monolithic micromechanical devices which include suspended microstructures and which may include circuitry.

BACKGROUND OF THE INVENTION

The construction of microsensors on microchips is of great interest in many industries because of its potential to reduce size and cost of devices which require the sensing of environmental or other conditions. An accelerometer is just one example of a type of sensor which has wide application possibilities.

Acceleration sensors are known for measuring force or mass or to operate control systems responsive to acceleration. For instance, acceleration sensors may be used in automotive vehicles to deploy air bags responsive to a particular threshold deceleration rate of a vehicle. Acceleration sensors may also be used in the automotive industry as part of active suspension systems in which microcontrollers adjust suspension components responsive to the vertical acceleration of the wheels.

An accelerometer comprises an acceleration-sensing element, or transducer, which is commonly interfaced to resolving circuitry for producing a useful output signal from the output of the transducer. Though the term "accelerometer" is sometimes used to refer to the sensor (or transducer) itself, the term is used herein to denote a complete system including a transducer as well as the resolving circuitry.

Many commercially available accelerometers employ transducers comprising a mechanical or electromechanical element (e.g., piezoelectric, piezoresistive or strain gauge).

Acceleration sensing microstructures embodied on silicon chips have been suggested in the prior art. For instance, U.S. Pat. No. 4,711,128 issued to Boura discloses an acceleration sensor formed by micromachining a fine monocrystal wafer. The sensor comprises a flat mobile mass suspended above the rest of the structure by means of two thin parallel strips situated on each side of the mass. The mass comprises at least one mobile capacitive plate which is disposed between two other capacitive plates which are not part of the suspended microstructure but are fixed on the structure. The mobile plates are charged to a voltage relative to the stationary plates. When the sensor is subjected to an acceleration, the mobile plates move relative to the fixed plates causing a change in capacitance between the mobile plates and each of the fixed plates. The change in capacitance is observed by observing the voltage between the mobile plate and the fixed plates and is a direct indication of the distance of movement of the fixed plate which, in turn, is a measurement of the acceleration.

U.S. Pat. No. 4,705,659 issued to Bernstein et al. teaches a technique of fabricating a free standing thin or thick structure such as an acceleration sensor, including the steps of providing a substrate, forming a layer of carbon on the substrate and depositing a film of polycrystalline material over the layer of carbon. The sandwich structure is heated in an oxidizing ambient to cause the oxidation of the carbon layer, leaving the polysilicon material as a free-standing film.

The prior art, however, does not teach a monolithic accelerometer in which the acceleration sensor as well as the resolving circuitry for producing a useful output are embodied on a single chip or a technique for making such a monolithic accelerometer. Thus, prior art accelerometers require a separate chip or other means containing circuitry for resolving the output of the sensor into a usable signal.

SUMMARY OF THE INVENTION

In accordance with the invention, a monolithic capacitance-type microstructure is provided. The microstructure comprises a semiconductor substrate including a surface, a plurality of posts extending from the surface of the substrate, a bridge suspended from the posts, the bridge including an element that is movable with respect to the surface of the substrate, and an electrically-conductive substantially stationary element anchored to the substrate and positioned relative to the movable element such that the movable element and the substantially stationary element form a capacitor. Preferably, the movable element is laterally movable with respect to the surface of the substrate.

The bridge may include a central beam and a plurality of generally parallel electrically conductive movable fingers extending transversely from the beam. The substantially stationary element may comprise a plurality of generally parallel electrically-conductive, substantially stationary fingers. Each of the substantially stationary fingers may correspond to one of the movable fingers and be positioned relative to the corresponding movable finger such that the movable finger and the corresponding substantially stationary finger form a capacitor, with movement of the movable fingers relative to the substantially stationary fingers altering the capacitance between each of the movable fingers and the corresponding substantially stationary finger.

According to a further aspect of the invention, a monolithic micromechanical apparatus may comprise a monolithic capacitance-type microstructure, as described above, and circuitry disposed on the substrate and operationally coupled to the movable fingers and the substantially stationary fingers for processing a signal based on a relative positioning of the movable fingers and the substantially stationary fingers. In a preferred embodiment, the monolithic capacitance-type microstructure comprises an acceleration sensor.

DETAILED DESCRIPTION

U.S. patent application Ser. No. 07/569,080 filed Aug. 17, 1990 and entitled MONOLITHIC ACCELEROMETER is assigned to the same assignee as this application, and the disclosure of that application is incorporated herein by reference. That patent application discloses a monolithic accelerometer which can be fabricated by the method disclosed herein. Further, U.S. patent application Ser. No. 07/872,037 entitled METHOD FOR FABRICATING MICROSTRUCTURES, filed on Apr. 22, 1992 and assigned to the same assignee as the present application, discloses an improvement on the method disclosed herein relating to a method for preventing the suspended microstructure from becoming damaged or stuck to the substrate during the fabrication processes. The disclosure of that patent application is also incorporated herein by reference.

Figure 1A:
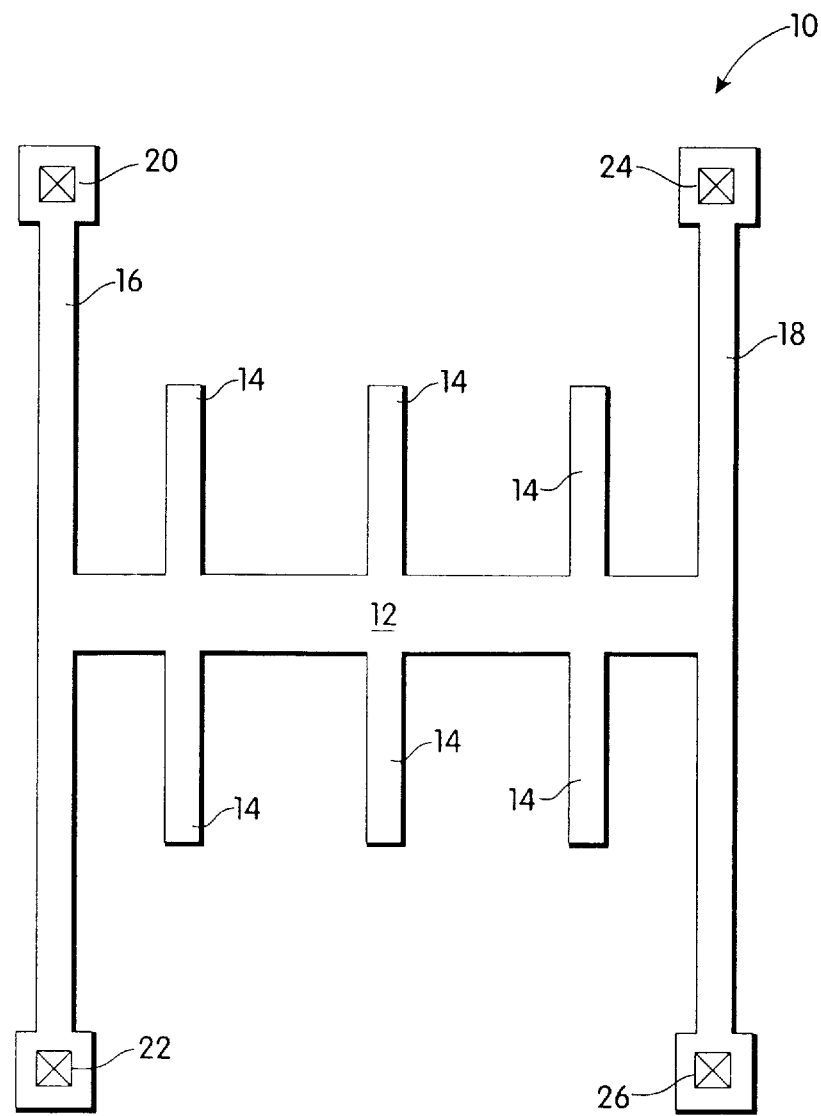
FIG. 1A is a top view of the suspended portion of an exemplary microstructure which can be fabricated by the process of the present invention.
Figure 1B:
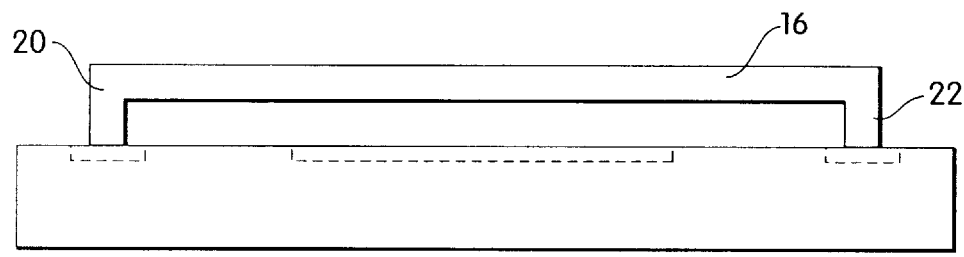
FIG. 1B is a side view of the exemplary suspended microstructure portion of FIG. 1A which can be fabricated by the method of the present invention.

FIGS. 1A and 1B are top and side views, respectively, of the suspended portion 10 of an exemplary microstructure which may be fabricated by the method of the present invention. As shown in the drawings, the suspended central beam 12 has a plurality of suspended arms 14 extending transversely therefrom. The beam 12 is supported at opposite ends from support beams 16 and 18. Support beams 16 and 18 are suspended above the silicon substrate by anchors 20, 22, 24 and 26.

Figure 2A:
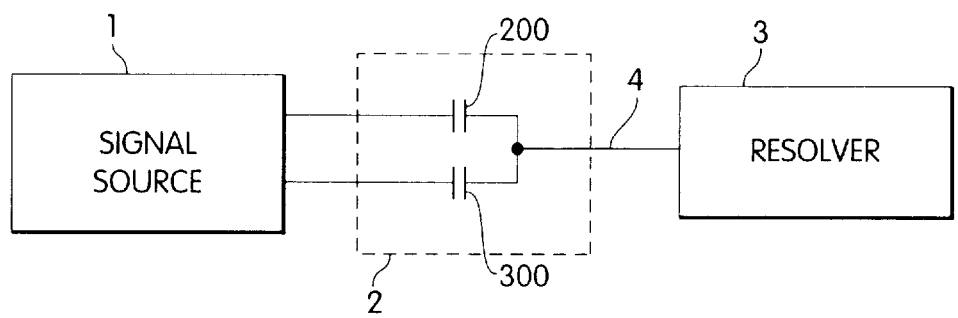
FIG. 2A is a high-level block diagram of a first embodiment of a differential-capacitor accelerometer according to the present invention.

FIGS. 1A and 1B show only the suspended portion of the microstructure. However, in an actual commercially usable device, the microstructure would also comprise fixed components. Referring now to FIG. 2A, a high-level block diagram is shown of a differential-capacitor accelerometer 10 according to the present invention. The accelerometer 10 comprises a signal source 1, sensor 2 having first and second differential capacitors 200 and 300, and a signal resolver 3. Differential capacitors 200 and 300 are fabricated so that one electrode of each moves when force is applied, such that one capacitance increases and the other decreases. The signal source 1 drives the capacitors 200, 300 with sinusoidal signals of equal frequency, phase and amplitude, but of opposite polarities. Consequently, the amplitude and phase of the signal at the junction 4 of the differential capacitors is a function of the difference in capacitances, which is directly related to the force-induced displacement of the capacitor electrodes due to acceleration. The signal resolver processes this signal, to generate therefrom a signal proportional to the acceleration of the capacitor plates relative to the substrate and package of the assembly.

Figure 2B:
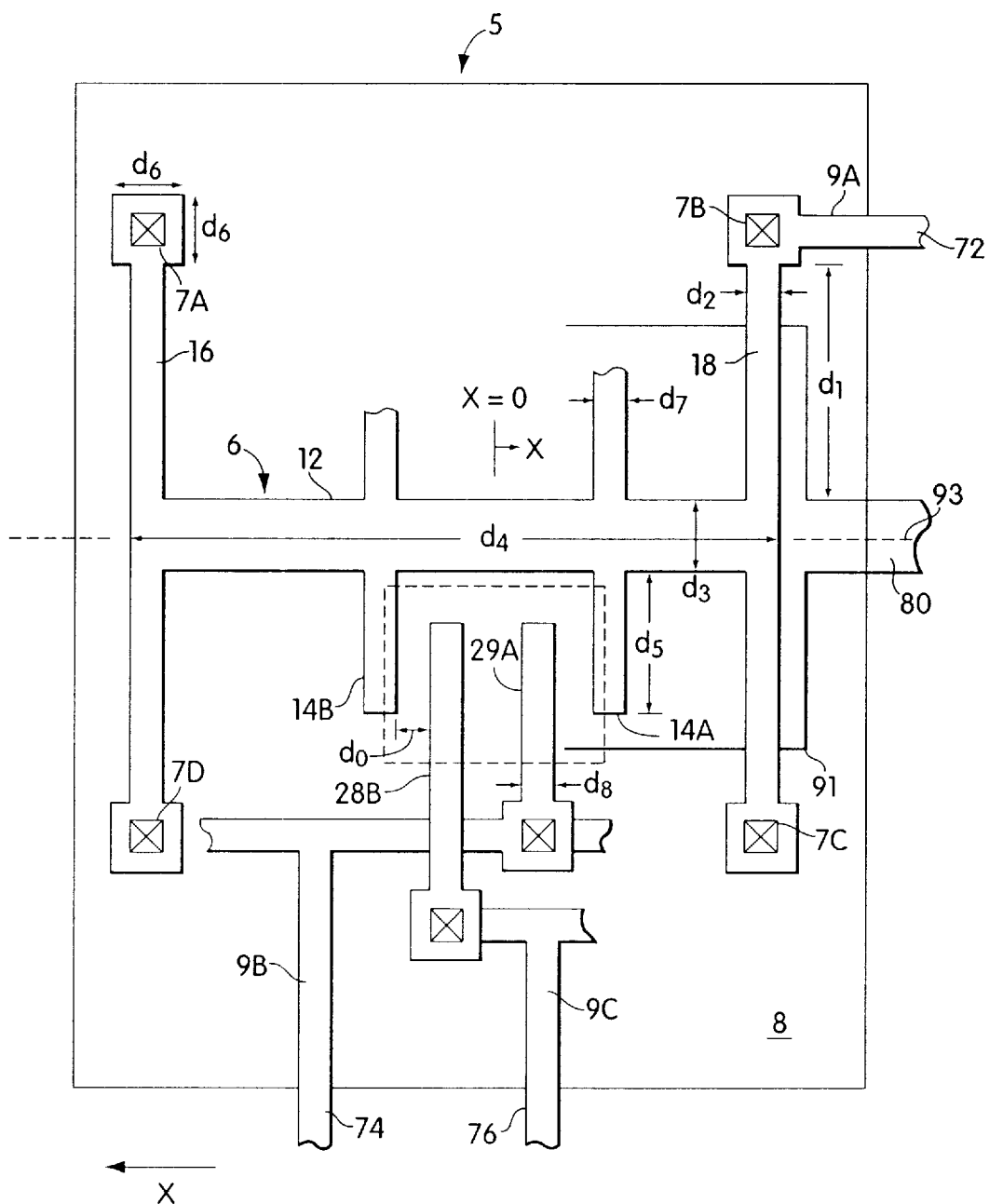
FIG. 2B is a simplified diagrammatic top view of an exemplary differential-capacitor accelerometer according to the invention.

Each of the electrodes of a differential capacitor sensor according to the present invention is formed of a plurality of segments which are arranged in such a manner that each capacitor is built up from a plurality of smaller capacitance "cells" connected in parallel. FIG. 2B shows a top view of an exemplary differential-capacitor sensor 5 according to the invention, but with only a single capacitance cell being depicted, to avoid unnecessary obfuscation of the inventive concept. On top of a silicon substrate 8, a suspended polysilicon "beam" 6 is formed. (The method of forming this suspended structure is discussed below.) Beam 6 rests above the surface of the substrate, on four posts, or anchors, 7A–7D, indicated by the "X" symbols in the figure. Beam 6 is generally H-shaped, with two elongated, narrow legs 16 and 18, and a transverse central member 12 suspended between them. Central member 12 is typically much stiffer and more massive than legs 16 and 18. A pair of beam fingers 14A and 14B depend in parallel orientation from central member 12, transversely to the axis 93 of the beam. Finger 14A forms one electrode of a parallel plate capacitor, having a stationary member 29A as its opposite electrode, or plate. Similarly, finger 14B forms one electrode of a second parallel plate capacitor, having a stationary member 28B as its opposite plate. Note that fingers 14A and 14B are connected together both physically and electrically and are, thus, a common electrode.

Electrical connection is made to fingers 29A and 28B via a heavily n+ doped region 9A and the polysilicon bridge itself. Electrical connection is made to plate 29A via a heavily n+ doped region 9B, and connection to plate 28A is made via a similar region 9C. As will be shown below, regions 9B and 9C may be extended to connect together, in parallel, the similar members of other capacitance cells.

Figure 2C:
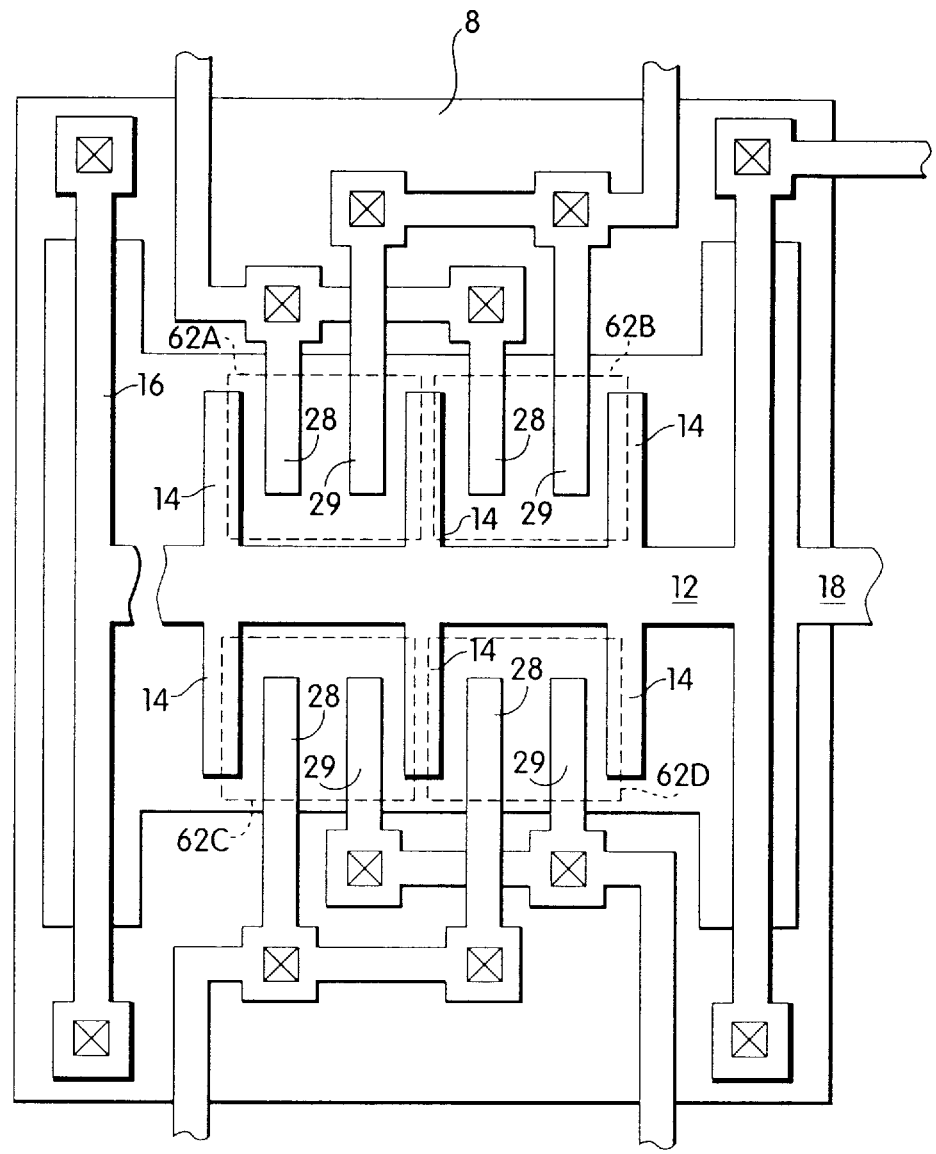
FIG. 2C is a simplified diagrammatic top view of a portion of a sensor according to FIG. 2B, with multiple capacitance cells.

An n+ doped region 91 also is provided beneath the entire polysilicon bridge structure, including the capacitance cells, as a bootstrap diffusion for reducing parasitic capacitance from the beam to the substrate. This is necessitated, at least in part, by the very low values of the capacitance per cell. In the example of FIGS. 2B and 2C, using the dimensions provided herein, each capacitor has a nominal capacitance of about 0.002 pF. With 56 cells in parallel, the total capacitance at rest is only about 0.1 pF. A full scale measurement involves only about an eight percent change in the value of each capacitor when the sensor is operated open-loop; naturally, in closed-loop operation the change is about ten times less.

The extension of the sensor architecture of FIG. 2B to multiple cells is illustrated in FIG. 2C for a four-cell example, the four cells being labeled 62A–62D.

The approximate dimensions below may be used to fabricate such a sensor, the dimension labels pertaining to the features shown on FIG. 2B:

$d_1$=300 micrometers
$d_2$=2.0 micrometers
$d_3$=40 micrometers
$d_4$=450 micrometers
$d_5$=125 micrometers
$d_6$=8 micrometers
$d_7$=5 micrometers
$d_8$=3 micrometers For purposes of reference in the discussion below, the heavily-doped, or metallization, regions 9A, 9B, 9C, and 91 are shown as terminating at terminals 72, 74, 76, and 80, respectively, though it should be understood that no actual connection terminal need be present at those physical locations.

When a force is applied to the substrate 8, in the x-direction, the substrate and plates move in that direction while the beam 12 tends to remain in its prior condition. Motion of the beam relative to the substrate is permitted by the fact that legs 16 and 18 are not absolutely rigid and will deflect slightly. When the force is in the positive x-direction, the separation between finger 14A and plate 29A increases, decreasing the capacitance in the capacitor they form; conversely, the separation between finger 14B and plate 28B decreases, increasing the capacitance in the capacitor they form.

Figure 2D:
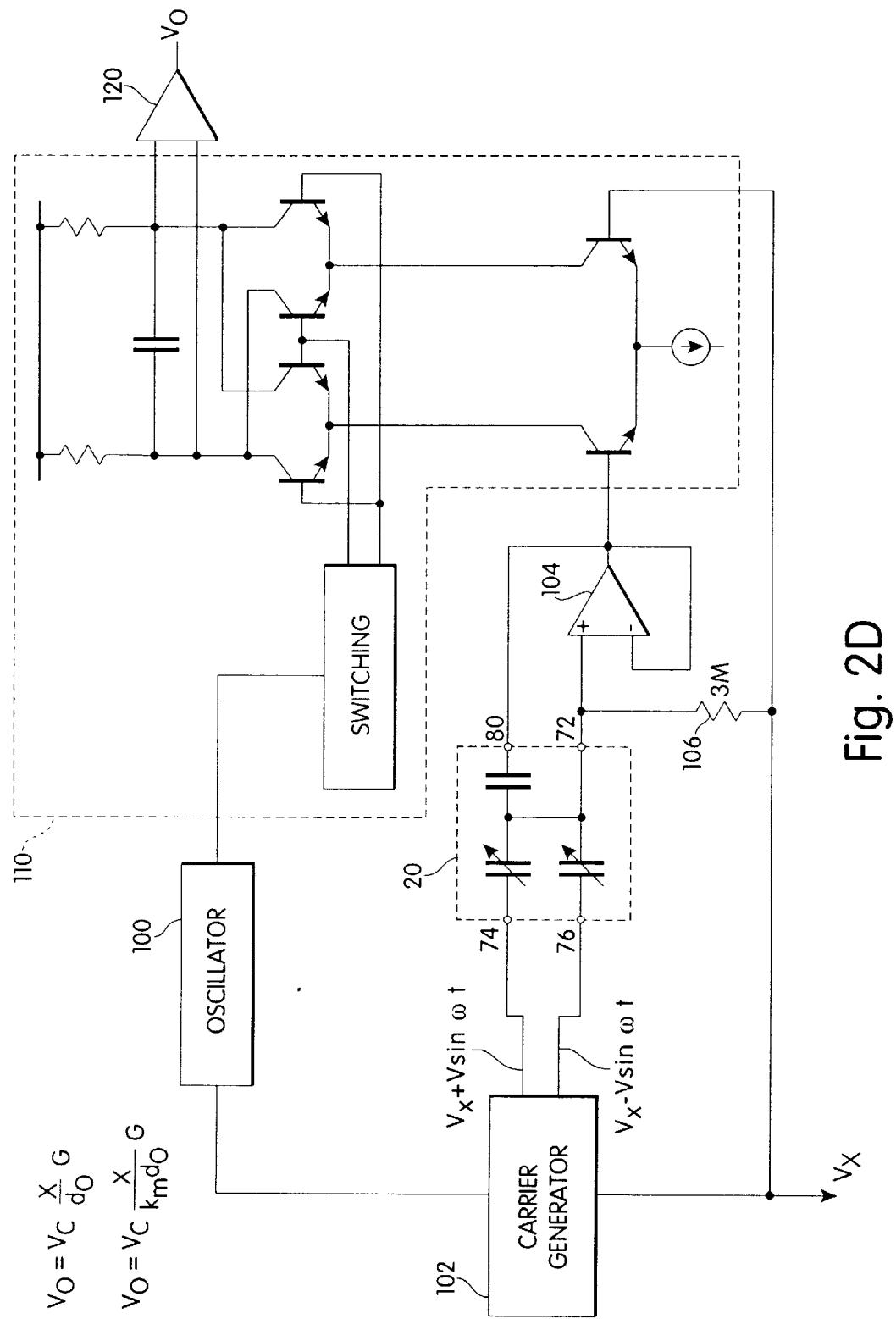
FIG. 2D is a partially block, partially schematic circuit diagram of a first exemplary embodiment of the accelerometer of FIG. 2A.

FIG. 2D provides a partially block-, partially schematic circuit diagram showing, in greater detail, a first (open-loop) embodiment of signal conditioning circuitry for use with the sensor of FIGS. 2B and 2C, for an accelerometer. The oscillator 100 supplies an approximately 1 MHZ sinusoidal signal to a carrier generator 102. The carrier generator supplies therefrom two 1 MHZ sinusoidal output signals 180 degrees out of phase from each other; thus, the output signals are of the form $V_c\sin \omega t$ and $-V_c\sin \omega t$, where $\omega$ is the angular frequency of the oscillator output signal. The first carrier signal is supplied to terminal 74 of sensor 5, while the second carrier signal is supplied to terminal 76. Sensor output terminal 72 is connected to the non-inverting input of a buffer amplifier 104. The output of the buffer amplifier is connected to sensor terminal 80, the bootstrap diffusion contact. Through this connection, the parasitic capacitance is prevented from loading the common node 72. A large resistance 106 (e.g., 3M) is connected between a reference supply voltage VX and the non-inverting input of buffer 104, to establish a d.c. operating point for the bridge.

The output of the buffer feeds a synchronous switching demodulator 110. The demodulator includes a switching circuit which is connected and responsive to the output of the oscillator 100. The double-ended output from the demodulator is converted to a single-ended output $V_o$ by a buffer amplifier 120. The value of $V_o$ is given by the formula $V_o=V_c m a G/k_m d_0$, where $V_c$ is the carrier amplitude, m is the bridge mass, a is acceleration, $k_m$ is the beam's mechanical spring constant, $d_0$ is the nominal capacitor gap, and G is a scaling factor which accounts for buffer, demodulator and output amplifier gains.

Figure 2E:
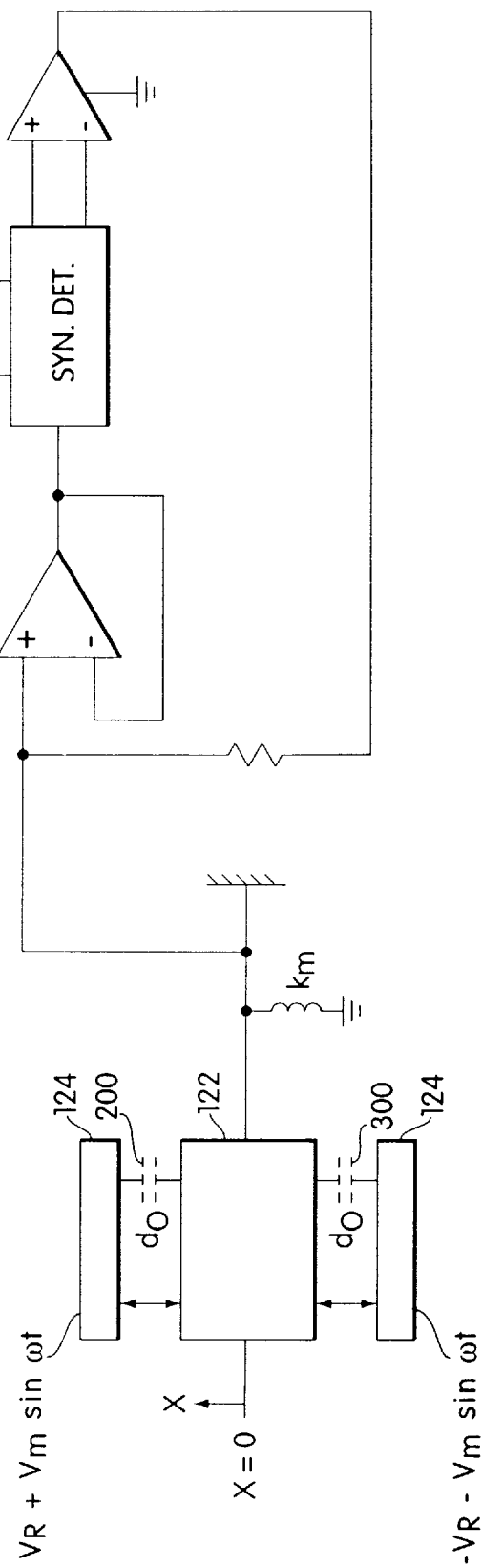
FIG. 2E is a partially diagrammatic, partially schematic circuit model of a second embodiment of an accelerometer according to the present invention.

Turning to FIG. 2E, a second embodiment is shown for signal conditioning circuitry employing the sensor of FIGS. 2B and 2C. In contrast to the open loop approach of FIG. 2D, the apparatus of FIG. 2E is a closed-loop, force-balance accelerometer. To better illustrate the force-balance principle, the bridge/differential-capacitor assembly is modeled as a conductive mass 122 suspended between a first capacitor plate 124 and a second capacitor plate 126, which establishes first and second differential capacitances, the latter being shown as capacitors 200 and 300, respectively. In the force-balance arrangement, capacitors 200 and 300 serve two purposes. First, they provide the means whereby electrostatic balancing forces are applied to the mass 122, at the acceleration frequency. Secondly, they allow the displacement x of the mass (i.e., the bridge mass) to be measured via the differential capacitance, at the carrier frequency. The negative feedback loop adjusts the output voltage $V_o$ so that x=0 and inertial force applied to the bridge equals the net electrostatic force which is applied. The force balance equation is as follows:

$$ma = \frac{\epsilon_o A}{2} \left[ \frac{(V_R + V_0)^2}{(d_0 + x)^2} - \frac{(V_R - V_0)^2}{(d_0 - x)^2} \right] \quad (1)$$

where
  m is the mass of the bridge,
  $\epsilon_0$ is the dielectric constant of air,
  A is the capacitor plate area (each capacitor, nominal),
  $d_0$ is the nominal, at rest, capacitor plate separation,
  x is the change in the capacitor plate separation (i.e., the distance the bridge moves due to the applied force), $V_R$ is the reference or d.c. offset voltage applied to the movable plates, and $V_o$ is the output voltage.

For $x \ll d_0$, at a large loop gain, the output voltage, $V_o$, due to acceleration, is as follows:

$$V_0 = \frac{mad_0^2}{2\epsilon_0 A V_R}$$

The output voltage is not sensitive to the spring constant of the structure, $k_m$, since the bridge remains undeflected. Full scale adjustment to compensate for values of m, $d_0$ and A which vary from nominal due to process variations can be made by trimming resistors R1 and R2 in FIG. 2F.

The beam geometry is designed to minimize the mechanical spring constant, $k_m$, so that a beam initially fabricated off-center will be centered automatically by a small percentage of the full scale electrostatic force. Then, a desired zero "g" output voltage level can be established by trimming the relative carrier amplitudes. Taken to the limit, the mass may be considered floating and self-centering; the mechanical spring constant does, however, prevent the mass from responding to the carrier signal.

Figure 2F:
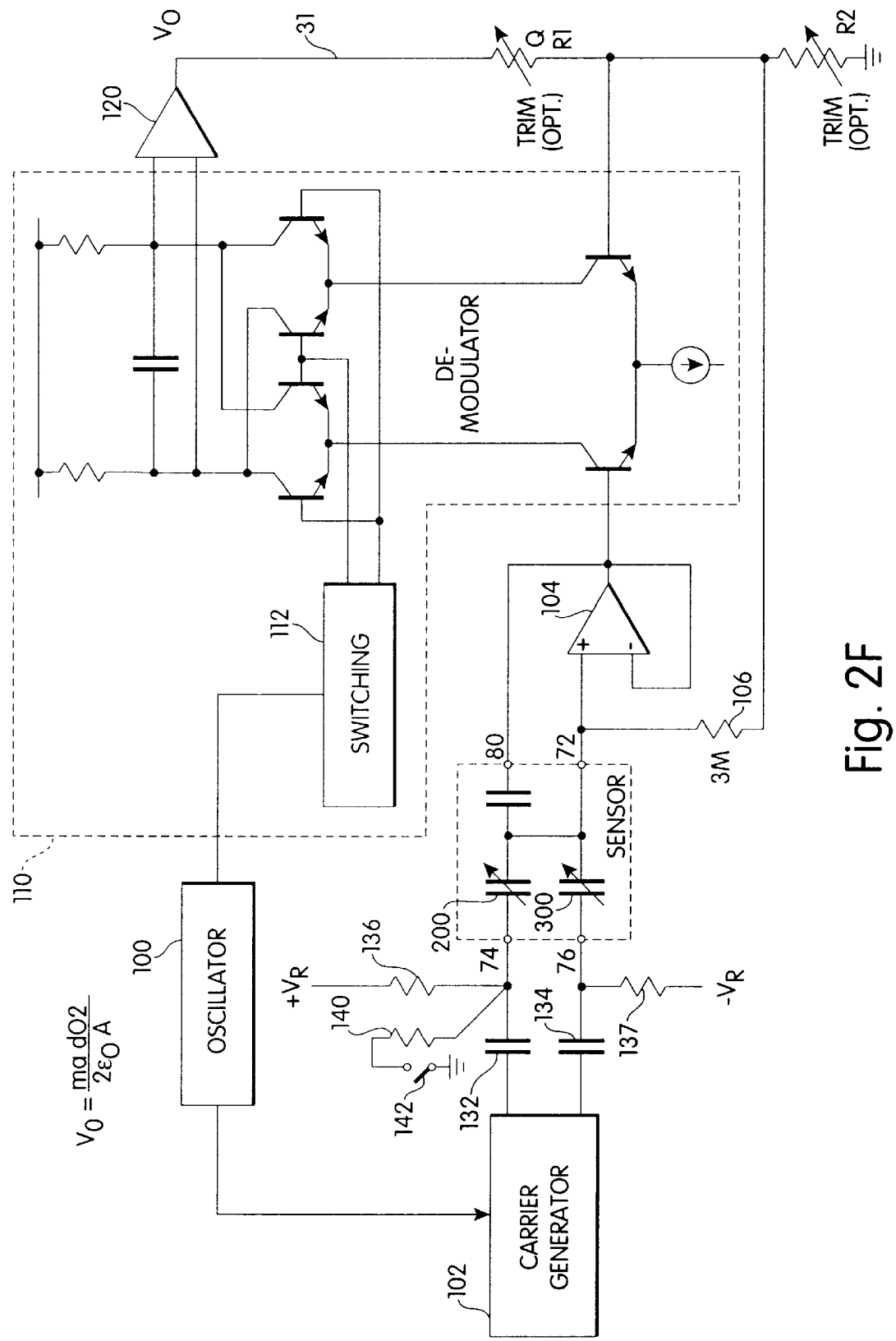
FIG. 2F is a partially block, partially schematic circuit diagram of the embodiment of FIG. 2E.

A more detailed design for the force-balance accelerometer of FIG. 2E is shown in FIG. 2F. The oscillator 100, carrier generator 102, buffer 104, and demodulator 110 are the same as the corresponding elements of FIG. 7. The carrier generator is, however, a.c.-coupled to the sensor through capacitors 132 and 134. Capacitors 132 and 134 may typically be about 30–50 pF each, to exhibit low impedance at the 1 MHZ carrier frequency. To establish a net electrostatic force on the sensor capacitor plates, input terminals 74 and 76 are connected, respectively, to positive and negative offset (i.e., reference) supplies $V_R$ and $-V_R$, through resistors 136 and 137, each typically being about 300k ohms. When the sensor capacitors 200 and 300 are equal (i.e., acceleration is zero), the electrostatic potential across the capacitors is balanced and equal. By contrast, acceleration causes the capacitors to have different values and the electrostatic potential on them to be unequal, causing a net unbalancing force. The demodulator detects this imbalance, which causes a change in the signal at the non-inverting input of amplifier 104, and supplies a feedback signal through resistor 106, to create a net electrostatic force to equalize the inertial force. Thus the feedback signal providing for force-balancing is supplied by connecting the junction of resistor 106 and the second demodulator signal input at the base of transistor 108 to the output of output buffer 120, instead of to fixed source VX.

Optionally, the circuit of FIG. 2F also has a resistor 140 and switch 142 connected in series between node 74 and ground. Closure of the switch will unbalance the input signals applied to nodes 74 and 76, which will apply a momentary electrostatic force on the bridge and produce a corresponding shift in the output to re-center the bridge. The output will be different if one or both capacitors fails (i.e., the bridge is untethered—broken—or the bridge is stuck). Thus, the closure of the switch can be used to test the proper operation of both the sensor and the circuitry.

Using the fabrication method of the present invention, the sensor of FIG. 2A and the circuitry of FIG. 2B can be embodied in a single chip, thus reducing the size and cost of the accelerometer.

The fabrication method of the present invention combines processes for fabricating BIMOS circuitry and for fabricating suspended microstructures in a mutually compatible manner. The overall method comprises approximately 330 individual steps.

Many of the approximately 330 individual steps are parts of processes which are well known in the art. For instance, the process of forming a photoresist mask by means of photolithography is well known in the prior art and comprises six individual steps. The individual steps of the present invention can be considered to comprise 67 processes. Some of the 67 processes are standard processes which are known in the art. The present invention lies in a novel combination of processes so as to fabricate a monolithic sensor as well as in the fact that some of the processes are novel in and of themselves.

On an even broader level, the overall method can be considered to comprise 20 tasks, each task comprising one or more of the processes. The detailed discussion of the invention herein is divided into 20 task headings. The section under each task heading is further divided into one or more processes. Where necessary, the individual steps of a process are discussed. However, as previously noted, many of the individual steps are well known in the prior art and thus are not described in great detail. Further, not all steps or processes are illustrated in distinct FIGS. in order to avoid obfuscation of the invention.

Starting Material

The starting material for the method of the present invention is a p-doped silicon substrate having a thin p-doped epitaxial layer thereover of approximately 30 microns in thickness.

Task 1: N-Well Implant.

This task involves implanting into the substrate the n-wells within which the transistors will be formed. It comprises processes 1–5.

Process 1: Oxide 1

A thermal oxide is formed on the surface of the chip by conventional thermal means. In particular, the chip is heated to approximately 1000° C. in an oxygen ambient environment, causing the silicon on the surface of the chip to oxidize, forming a thermal oxide, $SiO_2$, layer. The depth of oxidation is controlled by the temperature and exposure time. This layer is formed to a depth of approximately 3600 angstroms.

Process 2: N-Well Mask

This process involves patterning the oxide layer formed in step 1 into the desired pattern of n-wells on the substrate. This process comprises standard photolithography steps followed by etching of the oxide layer in a buffered oxide etch (hydrofluoric acid) bath.

In particular, photolithography comprises the steps of (1) coating the chip with a blanket layer of organic photoresist, (2) placing a mask in the form of the desired n-well pattern over, but not in contact with, the photoresist, (3) accurately aligning the mask over the chip, preferably in a stepper, so that all layers are formed in proper position relative to all other layers, (4) shining a light of specified wavelength through the mask onto the photoresist, causing the portions of the photoresist exposed under the mask to be developed while the portions occluded by the mask are not developed, (5) removing the mask, and (6) spraying the chip with a chemical wash which washes away the developed portion of the oxide layer.

After the six photolithography steps, the underlying oxide layer is exposed beneath the developed away portion of the photoresist. The chip is then dipped in a buffered oxide etch bath of hydrofluoric acid which etches through the exposed portion of the oxide layer but does not affect the portion of the oxide layer which is still covered by photoresist.

Commonly, the photoresist layer would be removed immediately after the etching of the underlying layer. In the present process, however, the photoresist is not yet removed for reasons which will be explained shortly.

Process 3: N-Well Implant

In this process, phosphorus is blanket deposited on the chip to a concentration of $5.0E12/cm^2$. The phosphorus is implanted into the substrate only in the areas defined by the thermal oxide mask. The phosphorus is deposited in a standard ion implantation process in which the chip is bombarded with a high energy beam of phosphorus particles (n-type particles). In the preferred embodiment, the particles are accelerated to approximately 100 kiloelectron volts (KeV) of energy.

The photoresist mask which was formed in process 1, but not yet removed, serves as an additional protective mask in this n-well implant process. After the phosphorus is deposited, the photoresist can be stripped away. This can be done by either dipping the chip in a sulfuric acid etch bath or by dry plasma stripping. In the preferred embodiment of the invention, it is done in an acid etch.

Process 4: N-Well Drive

At the completion of process 3, the phosphorus implanted in process 3 is diffused into the substrate only to a very shallow depth. The phosphorus now must be diffused (or driven) into the substrate to the desired depth. The phosphorous can be diffused deeper into the substrate in a thermal process. In the preferred embodiment of the invention, the chip is exposed to approximately 1250° C. for approximately 7 hours in an ambient environment including a small amount of oxygen (to allow for some oxidation) as well as a gas. The depth of diffusion can be controlled by both the duration and temperature of the process.

Process 5: Oxide Strip

The n-wells having been implanted and driven to the desired depth, the protective oxide layer formed in process 1 can now be removed. The chip is dipped into a buffered oxide etch bath. Since the photoresist mask has been removed, all remaining oxide is etched away leaving the bare silicon with n-wells.

Task 2: Thick Oxide

This task relates to field threshold adjust in order to improve surface isolation between the components which will be formed in the chip. It comprises processes 6–14. Thick oxide will be formed around essentially all individual transistors to increase surface isolation. However, the dopant level must be increased beneath the thick oxide regions to reduce surface leakage. Accordingly, arsenic will be implanted in the regions of the n-wells which will be covered by thick oxide (hereinafter n-field regions) to increase n-doping. In the other areas of the chip, boron will be implanted under the regions where the thick oxide will be formed (hereinafter p-field regions) in order to increase p-doping in those areas.

Process 6: Pad Oxide

In this process, a thin layer of thermal oxide (approximately 500 angstroms) is formed by oxidizing the surface of the chip as previously described with respect to process 1. This layer of oxide is formed in order to protect the silicon from the nitride which will be deposited in process 7. Nitride will damage bare silicon.

Process 7: LPCVD Nitride Deposit

In this process, a layer of approximately 1200 angstroms of silicon nitride is deposited in a standard low pressure chemical vapor deposition process. In low pressure chemical vapor deposition, the chip is placed in a low temperature furnace containing an ambient gas. In the case of a nitride deposition step, the ambient would include $NH_3$ and $SiH_2Cl_2$. The vaporized particles deposit themselves onto any available surface such as the substrate surface.

Process 8: Thick Oxide Mask

In this process, a photoresist mask is formed using conventional photolithography as previously described with respect to process 2. The mask is patterned to define the field inactive regions (i.e., n-field and p-field regions) of the chip where a thick layer of oxide is to be grown in an upcoming process for increasing surface isolation. Once the photoresist mask is formed, the nitride layer is etched by a conventional plasma etch. The photoresist mask is removed and the pad oxide is then etched in a conventional buffered oxide etch. Only the portions exposed through the nitride layer are etched away.

Process 9: P-Field Mask

Since p-fields and n-fields must be doped with different impurities, a conventional photoresist mask is formed defining only those areas exposed through the thick oxide mask in which p-field regions are to be formed.

Process 10: P-Field Implant

In this process, boron particles (p-type particles) are implanted in the p-field regions exposed under the mask of photoresist to a concentration of $5.5E13/cm^2$ at 50 KeV by conventional ion implantation such as was described with respect to process 3. After the boron is implanted, the photoresist mask is stripped away.

Process 11: N-Field Mask

This process is similar to process 9 except the mask defines the n-field regions rather than the p-field regions of the field area.

Process 12: N-Field Implant

In this process, arsenic is deposited to a concentration of $4.0E11/cm^2$ by an ion implantation process to form the desired n-field regions in the n-wells. In at least one preferred embodiment, the particles are accelerated to 100 KeV. The photoresist is then stripped away.

Figure 3:
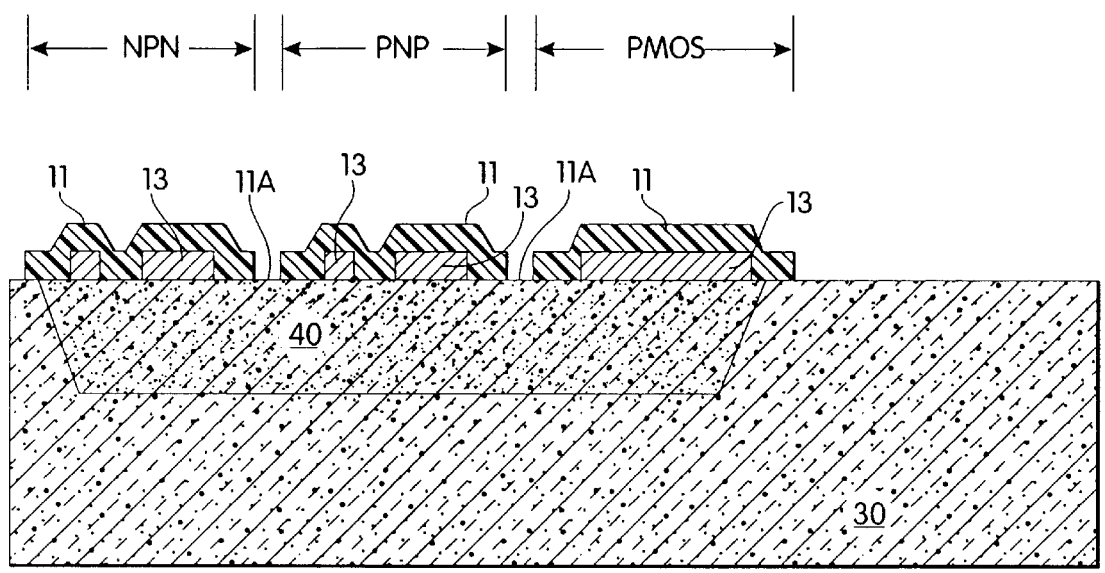
FIG. 3 is a cross-sectional view of the circuit region of an exemplary chip during a first stage of the fabrication method of the present invention.

FIG. 3 illustrates the state of the circuit region of the chip after the completion of the n-field implant of process 12, but before the photoresist mask is removed. The p-doped substrate as well as the p-epi layer are shown collectively as 30. An exemplary n-well formed in TASK 1 is shown at 40. The pad oxide layer (formed in process 6 and patterned in process 8) and the nitride layer (formed in process 7 and patterned in process 8) are shown collectively at 13. The n-field photoresist mask formed in process 11 is shown at 11 wherein openings 11a define the n-field regions. The actual p-fields and n-fields, however, are not represented in this FIG. since they have not been fully formed yet. In particular, they have not been diffused to the desired depth yet.

Process 13: Thick Oxide

In this process, a blanket thick oxide layer of approximately 14,900 angstroms is formed by thermal oxidation such as was described with respect to process 1. The oxide formed in this process will only form where the bare silicon is exposed under the etched nitride layer formed in processes 7 and patterned in 8. Since the nitride formed in process 7 and patterned in process 8 exposed the inactive regions of the substrate, the thick oxide forms only in those regions. The thick oxide improves the electrical isolation of the transistors which will be formed on the chip from each other and from the aluminum leads which will be formed. The thick oxide layer is a field threshold adjust layer.

This thermal process also serves to diffuse the boron and arsenic implanted in processes 10 and 12, respectively, thus completing the formation of the p-field and n-field regions.

Process 14: Nitride Strip

In this process, the chip is dipped in a phosphoric acid bath to remove all remaining nitride deposited in process 7. The chip is then dipped in a buffered oxide etch bath to remove the remaining oxide which was formed in process 6. The buffer oxide strip, of course, will also strip away some of the thick oxide layer formed in process 13. However, that layer is so thick that the vast majority of that layer remains after the oxide strip.

Task 3: Form Bases of Bipolar Transistors and Partially Form Sources and Drains of PMOS Transistors This task comprises processes 15–20. In this task, the bases of the bipolar transistors are formed. Since the sources and drains of the PMOS transistors have similar doping requirements, they are also partially formed in this task. The more shallow source and drain diffusions necessary to completely form the source and drains of the PMOS transistors are formed later during TASK 7.

Process 15: Sacrificial Oxide

In this process, a 850 angstrom thick layer of sacrificial oxide is grown on the chip by thermal oxidation. This sacrificial layer will serve to prevent channeling in the device as well as prevent damage from occurring in the upcoming base implant.

Process 16: Base Mask

In this process, a mask of photoresist is formed on top of the sacrificial oxide layer to define the desired bipolar transistor bases and PMOS sources and drains by standard photolithography steps as previously described. The sacrificial oxide layer is then etched into the transistor base pattern in a buffered oxide etch bath also as previously described.

Process 17: Base Implant

In this process, p-type particles (boron particles) are ion implanted into the substrate in the pattern dictated by the mask formed in process 16. After the implantation, the photoresist is stripped away.

Process 18: Plate Mask

In this process, another photoresist mask is formed by standard photolithography. The mask is formed so as to protect the circuitry area but expose the moat area of the chip.

Process 19: Plate Implant

In this process, boron is ion implanted in the sensor area through the mask formed in process 18. This implantation creates a more heavily p-doped area (or plate) in the moat region. The plate serves as a field threshold adjust to improve isolation between the arms of the sensor. The photoresist is stripped away after the plate implantation.

Process 20: Base Drive

In this process, the boron implanted in process 17 to form the bases of the bipolar transistors and to partially form the sources and drains of the PMOS transistors is diffused into the n-wells to the desired depth in a high-temperature diffusion process such as previously described with respect to process 4. The boron implanted in step 19 is also diffused at this time.

Figure 4:
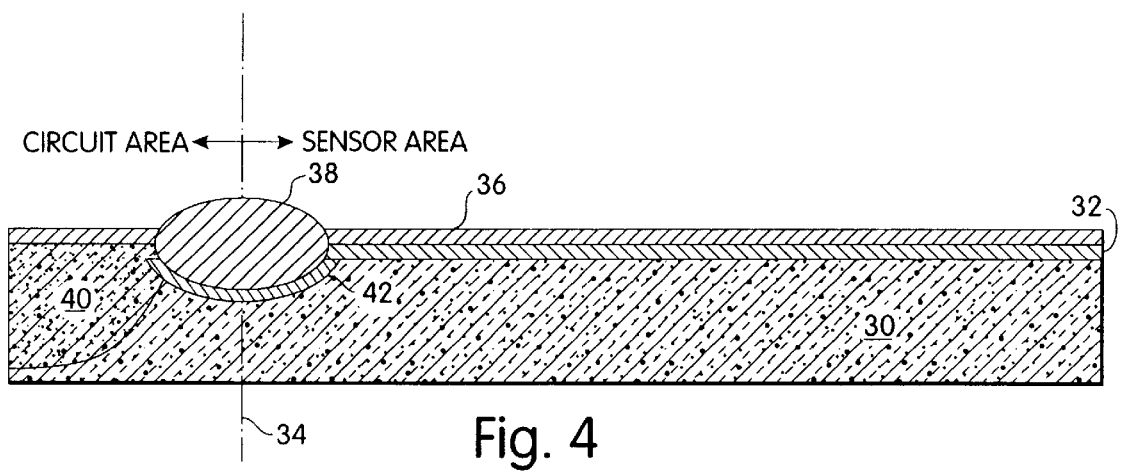
FIG. 4 is a cross-sectional view of the sensor region of the sensor region of an exemplary chip during a second stage of the fabrication method of the present invention.

FIG. 4 illustrates the state of the chip and particularly the moat region, after the completion of process 20. As before, the p-doped substrate as well as the p-epi layer are shown collectively as 30. The plate layer formed in process 19 is shown at 32. Dotted vertical line 34 is the dividing line between the sensor area (or moat area) and the circuit area of the chip. As can be seen in that figure, the plate appears only in the moat area. The sacrificial oxide layer formed in process 15 is shown at 36 and covers both the circuit area and the sensor area. An exemplary thick oxide region formed in task 2 (processes 7–14) is shown at 38. Thick oxide region 38 in FIG. 4 is part of a ring of thick oxide (formed in task 2) which completely surrounds the moat area. Of course, thick oxide has been deposited in other regions as well. An exemplary n-well region in the circuit region is illustrated at 40. A p-field formed in step 10 beneath thick oxide region 38 is shown at 42.

Task 4: Form Conductors from Moat Area to Circuit Area and Bipolar Transistor Emitters This task comprises processes 21–23. In this task, the emitters for the bipolar transistors are implanted. Further, n+ runners between components of the sensor and the circuitry are also formed. These conductors are essentially long emitter regions and, thus, can be formed during the same processes as the transistor emitters.

Process 21: Emit Mask

A layer of photoresist is deposited and patterned to define the bipolar transistor emitters as well as the n+ runners (conductors) from the sensor area to the circuit area. These runners will electrically connect the polysilicon sensor to the BIMOS circuitry.

Process 22: Emit Implant

In this process, arsenic is ion implanted to a concentration of $6.18E15/cm^2$ at 150 KeV to form the emitters and n+ runners.

Process 23: Emit Drive

In this process, the arsenic is diffused in to the desired depth and concentration in a high temperature diffusion process.

Figure 5:
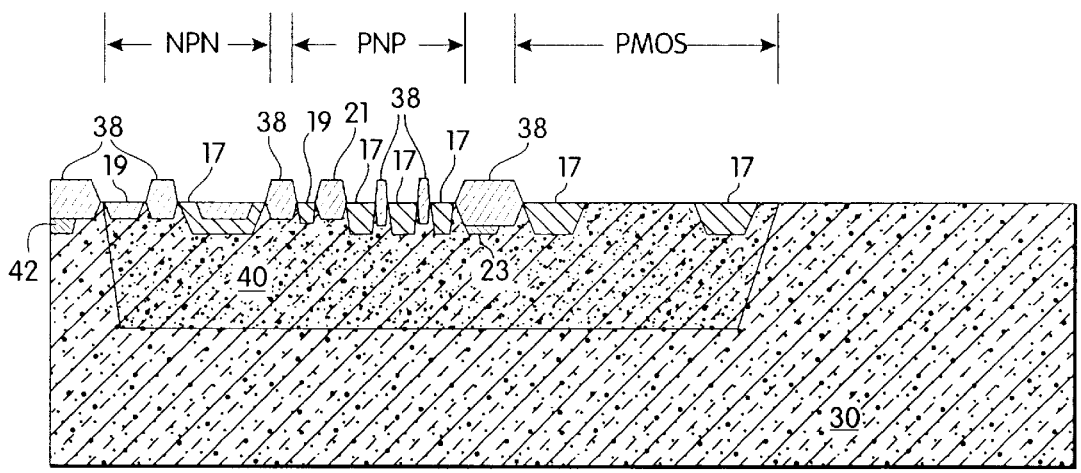
FIG. 5 is a cross-sectional view of the circuit region of an exemplary chip during a third stage of the fabrication method of the present invention.

FIG. 5 shows the circuit region of the chip at the completion of process 23. Reference numeral 17 denotes the base regions of the bipolar transistors and partially formed source and drain regions of the PMOS transistors formed in processes 16, 17 and 20. Reference numeral 19 denotes the emitter regions formed in processes 21, 22 and 23. Reference numeral 38 denotes the thick oxide layer formed in processes 8 and 13. Reference numeral 23 denotes an exemplary n-field formed in processes 11, 12 and 13. Finally, reference numeral 42 denotes an exemplary p-field formed in processes 9, 10 and 13.

Task 5: Form Gate Oxide Regions

This task comprises processes 24–26. In this task, the dielectric of the MOS transistors is formed.

Process 24: PVT Implant

In this process, boron is implanted to a concentration of $4.5E11/cm^2$ at 50 KeV. This blanket layer of boron is a threshold adjust for the PMOS transistors.

In the embodiment of the invention for manufacturing the monolithic accelerometer shown in FIGS. 1A, 1B, 2A and 2B and disclosed in U.S. patent application Ser. No. 07/560, 080, the circuitry comprises no NMOS transistors. Accordingly, the boron can be deposited in this step without benefit of a mask. Although the boron is blanket deposited on the chip, it only significantly affects the channel regions since the other regions of the chip are already so heavily doped that this relatively small addition of boron will not significantly affect the other regions. The additional steps necessary to adapt this process to a device also having NMOS transistors, however, would be obvious to a person of ordinary skill in the relevant art.

Process 25: Sacrificial Oxide Strip

In this process, the sacrificial oxide layer which was formed in process 15 is now stripped away in a buffered oxide etch bath.

Process 26: Gate Oxide

In this process, a thermal oxide is grown on the chip to a depth of 725 angstroms. This layer will comprise the capacitive oxide beneath the gates of the MOS transistors.

Figure 6:
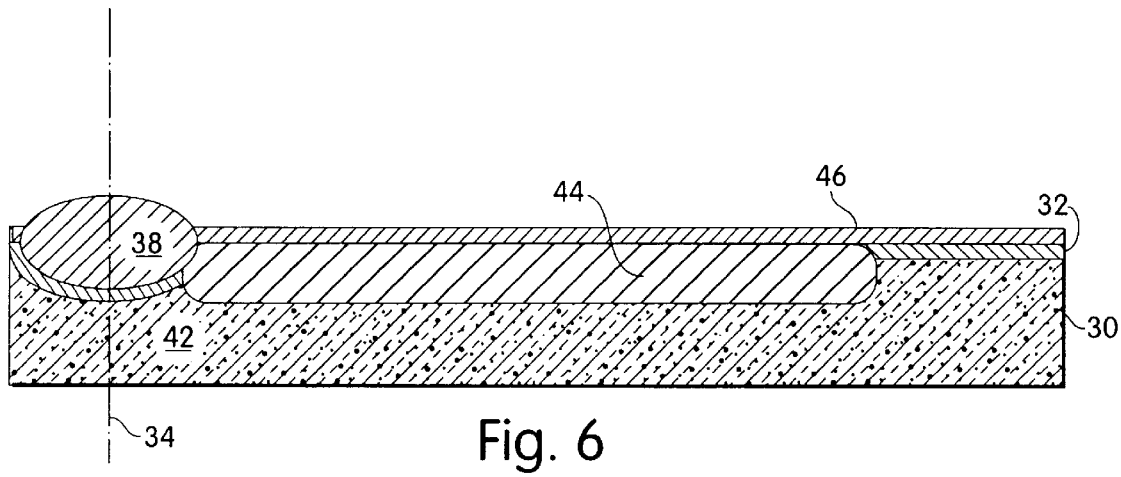
FIG. 6 is a cross-sectional view of the sensor region of the sensor region of an exemplary chip during a fourth stage of the fabrication method of the present invention.

FIG. 6 illustrates the moat area of the chip after the completion of process 26. As shown in FIG. 6, at this point, the moat area has three layers above substrate 30. They are plate layer 32, n+ conductors 44 and gate oxide blanket layer 46.

Task 6: Form Gates

This task comprises processes 27–29. In this task, the polysilicon gates of the BIMOS transistors are formed.

Process 27: Gate Polysilicon Deposit

In this process, a blanket layer of polysilicon is deposited on the chip. Polysilicon deposition techniques are well known in the art. For instance, the polysilicon may be deposited in a chemical vapor deposition technique involving exposing the chip in a high temperature furnace with an ambient containing vaporized silicon hydride ($SiH_4$). The silicon hydride decomposes in the high temperature and deposits onto all available surfaces, i.e., the chip. In the preferred embodiment of the present invention, the polysilicon is deposited to a depth of 5500 angstroms. This blanket of polysilicon will be formed into the gates of the MOS transistors in upcoming processes.

Process 28: $POCl_3$ Polysilicon Doping

In this process, the polysilicon deposited in process 27 is highly doped (20 ohms/sq) with $POCl_3$ in order to increase its conductivity. In the preferred embodiment of the invention, the polysilicon is doped in a deposition cycle of a diffusion process in which the chip is placed in a high temperature furnace with ambient $POCl_3$. Although similar to a chemical vapor deposition technique, this process is not considered a chemical vapor deposition because, instead of depositing a new layer of material, this process dopes the prior existing layer with an impurity.

Process 29: Polysilicon Mask

In this process, a photoresist layer is formed over the polysilicon and patterned into the desired gate pattern. The polysilicon is then etched in a dry plasma etch to form the gate regions.

Figure 7:
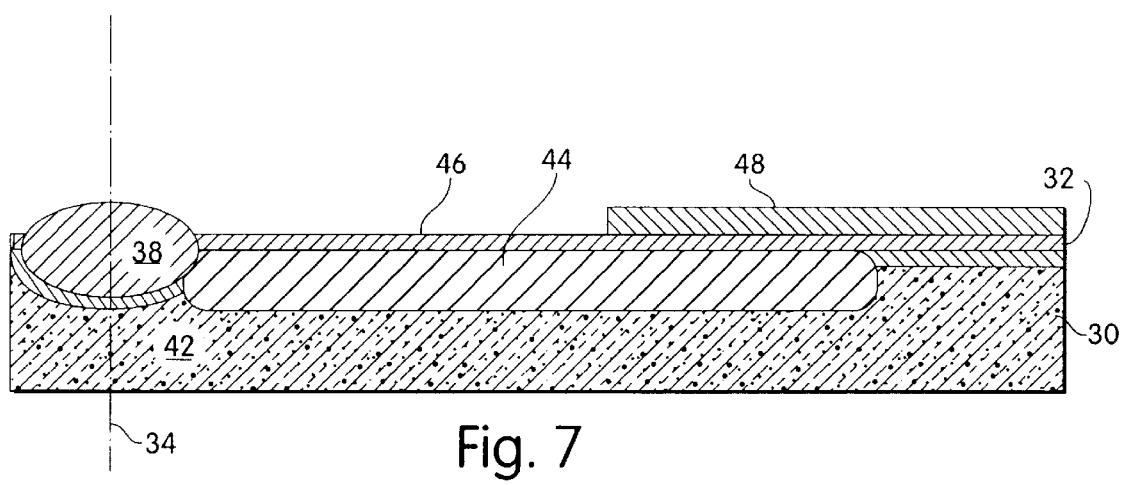
FIG. 7 is a cross-sectional view of the sensor region of the sensor region of an exemplary chip during a fifth stage of the fabrication method of the present invention.

FIG. 7 illustrates the sensor area of the chip after completion of process 29. In addition to forming the gate regions, an island of gate polysilicon 48 is also formed over the moat area. This polysilicon island will act as an etch stop when removing BPSG in a subsequent process. Near the end of the fabrication method, a process will remove all gate polysilicon from the sensor region except for a narrow ring.

Task 7: Form Shallow P-Type Source and Drain Regions for BIMOS Transistors

This task comprises processes 30 and 31, in which the source and drain regions of the PMOS transistors are formed.

Process 30: P-Type Source and Drain Mask

In this process, a photoresist mask is formed by standard photolithography steps to define the source and drain regions of the PMOS transistors.

Process 31: PSD Implant

In this process, boron (p-type) is ion implanted to a concentration of $1.5E13/cm^2$ at 40 KeV. The photoresist is stripped subsequent to the boron implantation.

Task 8: BPSG Planarization

At this stage in the fabrication of the device, the surface topography of the chip is relatively severe (i.e., rough). In subsequent processes, it will be necessary to form metal leads on the surface of the chip. It is preferable that the metal be deposited on a relatively smooth surface. Accordingly, in processes 32–35, a borophosphosilicate glass (BPSG), which essentially comprises $SiO_2$ with small amounts of boron and phosphorus, is deposited and reflowed to provide a smoother surface for the metallization process. Otherwise, the severe topography of the surface of the chip would make it difficult to deposit metal leads without cracking.

Process 32: LPCVD Nitride Deposition

In this process, a 200 angstrom thick layer of nitride is deposited on the surface of the chip by low-pressure chemical vapor deposition. This nitride layer protects the underlying gate oxide from the BPSG layer which will be deposited in process 33. The nitride prevents the BPSG from diffusing into and beyond the gate oxide layer.

Process 33: BPSG Deposition

In this process, a 5500 angstrom thick layer of borophosphosilicate glass is plasma enhanced chemical vapor deposited. The BPSG layer will be reflowed to provide a planarization layer for reducing the severity of the topography such that metal interconnects and contacts can be deposited subsequently with reduced risk of cracking. The BPSG will be reflowed to planarize the chip surface in process 34.

Process 34: Source and Drain Drive

In this process, the boron deposited as source and drain regions is diffused to the desired depth and concentration. In at least one preferred embodiment, the chip is exposed to 1000° C. for approximately 2 hours. This process is actually part of both task 8 (planarization) and task 7 (formation of the source and drain regions). This process is performed subsequent to the BPSG deposition to accomplish source/drain drive as well as BPSG reflow (i.e., melt and resolidify the BPSG so it forms a smooth planar surface upon which the metal interconnects can be formed).

Process 35: LPCVD Nitride Deposition

In this process, another 200 angstroms of nitride are deposited over the BPSG layer. This nitride layer will act as an etch stop in the circuit area when it becomes necessary to wet etch through dielectrics deposited for the purposes of constructing the sensor. Dielectrics are commonly laid down as a blanket and thus the sensor dielectrics will also be formed in the circuit area at some point. Accordingly, they must be removed from the circuit area. This nitride layer will act as an etch stop when it becomes necessary to remove those dielectrics.

Figure 8:
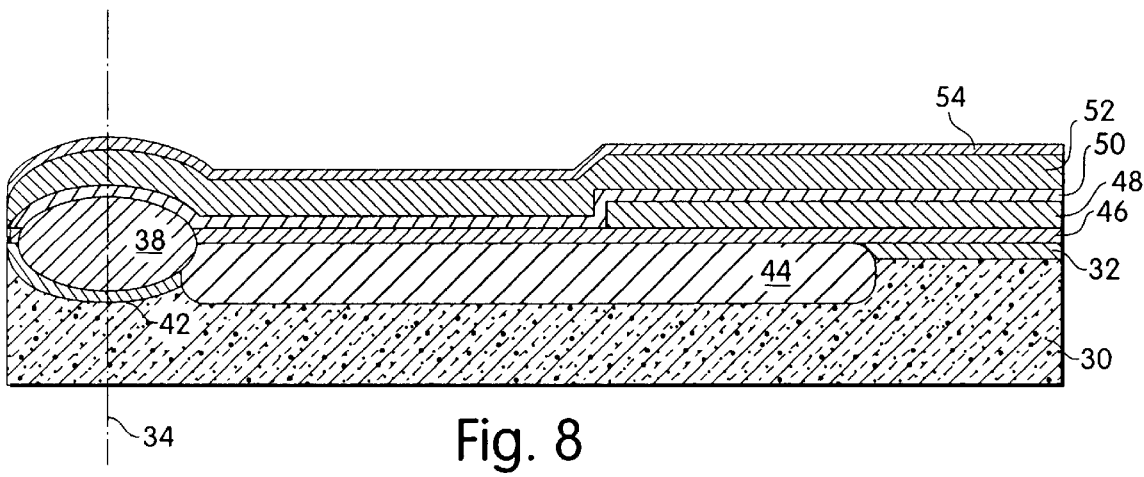
FIG. 8 is a cross-sectional view of the sensor region of the sensor region of an exemplary chip during a sixth stage of the fabrication method of the present invention.

FIG. 8 illustrates the condition of the sensor area of the chip after the completion of process 35. The nitride layer deposited in process 32 is shown at 50, the BPSG layer formed in process 33 is shown at 52, and the nitride layer formed in process 35 is shown at 54.

Task 9: Clear Moat Area

As can be seen from FIG. 8, at this stage in the fabrication method of the present invention the moat region is covered with a number of layers of dielectric which were deposited for BIMOS circuitry formation. In processes 36 through 40, the unnecessary dielectrics will be removed from the moat area and the surface concentration of the p-regions will be increased to reduce the probability of surface leakage between the n+ runners. Further, after the moat area is cleared of all BIMOS dielectrics and its dopant concentration has been increased, several dielectric layers for the moat are formed.

Process 36: Moat Mask

In this process, a photoresist layer is deposited and patterned to expose only the moat region. Then, the nitride layer deposited in process 35 is removed in a dry etch process, the BPSG planarization layer deposited in process 33 is removed in a wet etch process, the nitride layer formed in process 32 is removed in another dry etch process and, finally, the polysilicon layer deposited in process 27 is removed in a dry etch process. At this point, the gate oxide is now exposed in the moat region.

Process 37: Moat Implant

In this process, more boron is ion implanted in the moat area (the remainder of the chip is still protected by the photoresist). The boron is implanted to a concentration of $5E12/cm^2$ at 50 KeV. This boron implantation procedure serves the same function as the plate implant procedure of process 19, i.e., as a field threshold adjust to increase componentry electrical isolation. The process is split into two separate implantations because, at this point, the initial plate implant has been substantially depleted from the surface due to exposure to several thermal operations and the segregation nature of boron.

Figure 9:
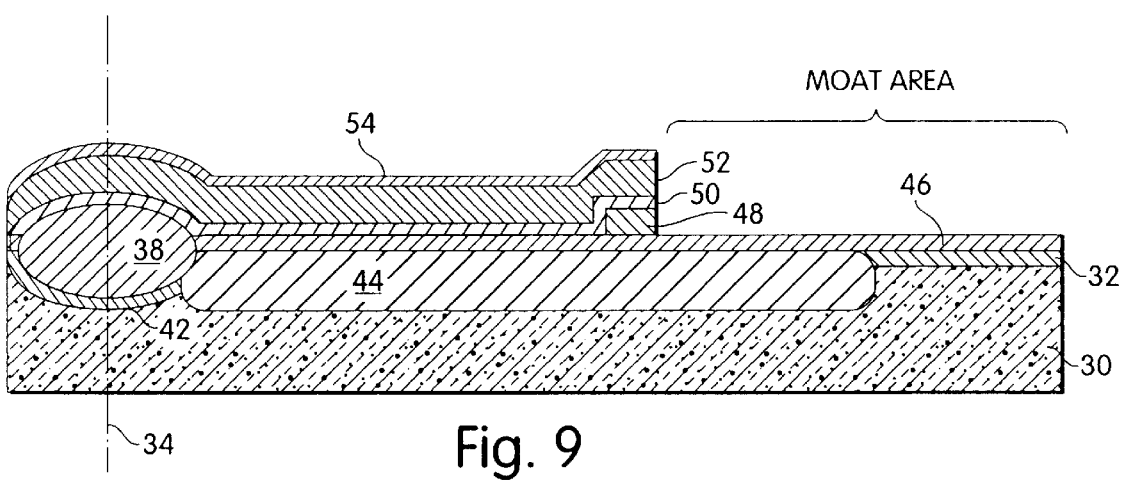
FIG. 9 is a cross-sectional view of the sensor region of the sensor region of an exemplary chip during a seventh stage of the fabrication method of the present invention.

FIG. 9 shows the chip after the completion process 37. As can be seen, the moat area is exposed down to the gate oxide 48.

Process 38: LTO Deposition

In this process, a 2,000 angstrom thick layer of low temperature oxide is deposited over the chip. This increases the total oxide thickness from about 600 angstroms to about 2600 angstroms in the field regions and ensures adequate surface passivation. In this process, the oxide is not formed by a thermal process as previously described wherein the exposed silicon surfaces oxidize. Instead, in this process, the oxide is deposited in a chemical vapor deposition type process. Essentially, the chip is placed in a low temperature furnace with a silicon compound and oxygen ambient. The ambient oxide precipitates onto the surface of the silicon. This process does not use up any silicon on the substrate.

Process 39: Densification

The low temperature oxide deposited in process 38 is now densified to slow down its etching. Essentially, the chip is placed in a high temperature furnace for a specified period to densify the oxide.

Process 40: LPCVD Nitride Deposition

A 1200 angstrom thick layer of nitride is deposited over the densified low temperature oxide. This layer will act as an etch stop with respect to the etching of another low temperature oxide layer which will be deposited over this nitride layer in process 41. This nitride layer will also permit the nitride-to-nitride sealing discussed in Task 19.

Figure 10:
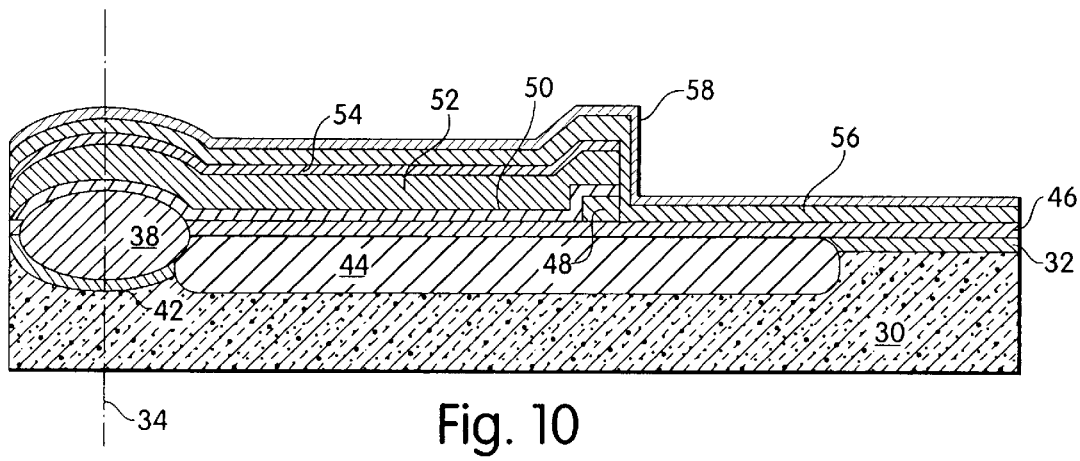
FIG. 10 is a cross-sectional view of the sensor region of the sensor region of an exemplary chip during an eighth stage of the fabrication method of the present invention.

FIG. 10 shows the chip after the completion of process 40. As shown therein, a layer of low temperature oxide 56 has been deposited followed by a layer of nitride 58.

Task 10: Form Spacer Oxide

The microstructure should be able to withstand normal operating conditions after the complete chip has been fabricated and packaged. For instance, the monolithic accelerometer which is contemplated for fabrication by the method of the present invention is expected to withstand accelerative forces on the order of 100 g. Nevertheless, during fabrication, the microstructure undergoes processes and is exposed to environmental conditions which are significantly more harsh than it is likely to encounter during operation. Thus, precautionary measures must be built into the microstructure as well as the method for fabricating the microstructure in order to reduce the possibility of damaging the microstructure during fabrication.

The spacer oxide serves two functions. First, the polysilicon microstructure will be deposited and formed over the spacer oxide and then the spacer oxide will be etched away from underneath the microstructure leaving it suspended. The spacer oxide is not removed until essentially the very end of the method. Accordingly, a second function of the spacer oxide is to rigidly support the suspended microstructure which otherwise might be damaged when exposed to the conditions and processes of fabrication.

The formation of the spacer oxide comprises process 41–43.

Process 41: Space Oxide Deposition

In this process, the spacer low temperature oxide (LTO) which will support the microstructure is deposited by chemical vapor deposition. This layer is grown to approximately 16,000 angstroms.

Process 42: Densification

In this process, the chip is exposed to a high temperature for an extended period of time in order to densify the spacer LTO layer to slow down its etching. This will allow for much more accurate etching of the spacer oxide.

Process 43: Bumps Mask

In this process, a photoresist layer is deposited over the spacer LTO and patterned to form small openings interspersed in the sensor area. The spacer oxide is then etched in a buffer oxide etch bath. The chip is only exposed to the buffer oxide etch for a limited period of time so that only small divots will be taken out of the top surface of the spacer LTO rather than etching completely through the spacer LTO down to the underlying nitride layer. Thus, when the microstructure is formed over the spacer LTO, there will be small bumps in its bottom surface adjacent to the position of the divots in the spacer oxide.

These bumps, will serve to minimize surface area contact of the microstructure to the chip during and after removal of the spacer oxide. During and after the etch for removing the spacer oxide to leave the microstructure suspended, the relatively delicate microstructure can be bent such that it comes in contact with the underlying substrate. This is undesirable since the microstructure has a tendency to stick to the substrate. By placing small bumps in the bottom surface of the microstructure, if and when the bottom surface of the microstructure comes in contact with the substrate, only the bumps will contact the surface thereby minimizing the contact surface area and the likelihood of sticking.

Figure 11:
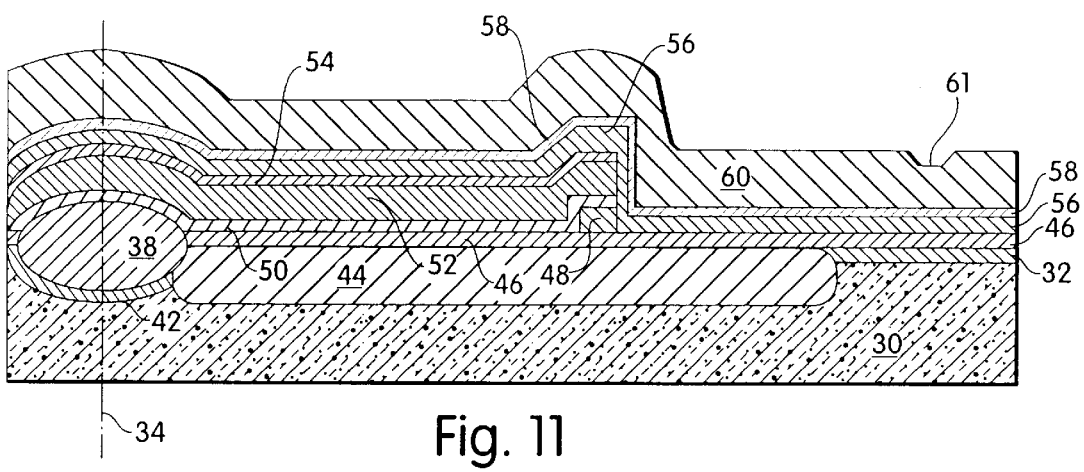
FIG. 11 is a cross-sectional view of the sensor region of the sensor region of an exemplary chip during a ninth stage of the fabrication method of the present invention.

FIG. 11 shows the chip after the completion of process 43. As shown therein, a thick layer of spacer oxide 60 has been deposited over the entire chip and small divots such as divot 61 have been formed in its upper surface.

Task 11: Anchor Formation

In the exemplary accelerometer illustrated in FIGS. 1A, 1B and 2A, the microstructure is suspended from four anchors, and the fixed arms are individually anchored to the substrate in the same manner. Processes 44 and 45 relate to the preparation for forming the anchors of the microstructure.

Process 44: Anchor Mask

In this process, a photoresist mask is formed defining the anchors from which the polysilicon microstructure will be suspended. The spacer oxide, nitride, and additional underlying oxides are dry etched, thus exposing the n+ runners beneath, such as runner 44 (see FIG. 12).

Process 45: Anchor Implant

In this process, phosphorous is implanted to a concentration of $4.0E15/cm^2$ in an ion implantation process at 30 KeV. The phosphorous is implanted so as to allow the polysilicon anchors, when formed, to make good ohmic contact to the underlying n+ runner, e.g., 44. The phosphorous implantation increases the phosphorous concentration at the polysilicon/silicon interface, encouraging uniform recrystallization at the anchor point and reducing anchor resistance.

Figure 12:
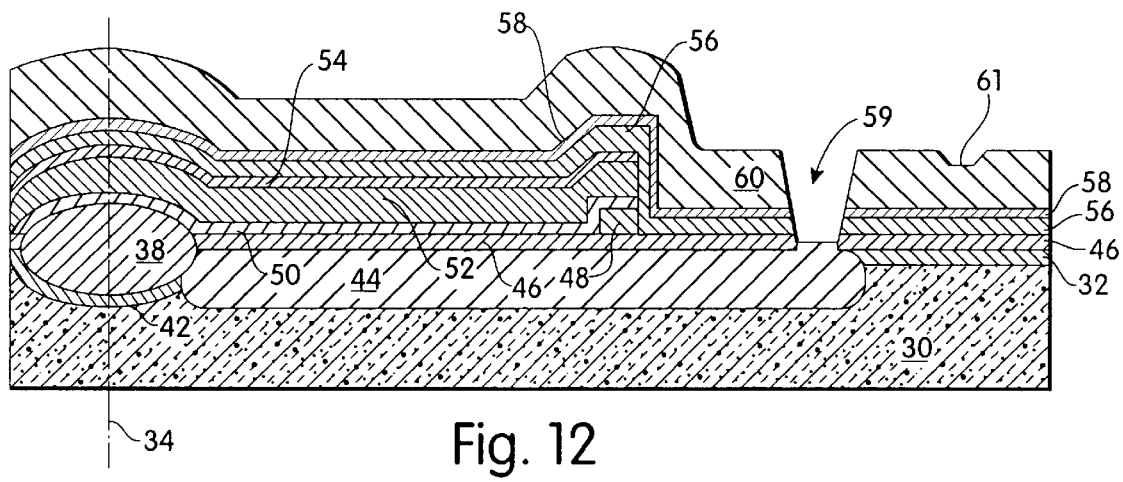
FIG. 12 is a cross-sectional view of the sensor region of the sensor region of an exemplary chip during a tenth stage of the fabrication method of the present invention.

FIG. 12 shows the chip after the completion of step 45, including exemplary anchor opening 59.

Task 12: Polysilicon Microstructure Formation

Processes 46–49 relate to the formation of the suspended microstructure. However, as noted earlier, the microstructure will not be suspended, but will be supported by the spacer LTO, until essentially the end of the fabrication method.

Process 46: Sensor Polysilicon Deposition

In this process, a 20,000 angstrom thick layer of polysilicon is deposited over the spacer oxide in a low pressure chemical vapor deposition process. This is the polysilicon layer from which the microstructure will be formed. A low deposition temperature is used to produce a partially amorphous film.

Process 47: Sensor Polysilicon Implant

In this process, the microstructure polysilicon is made more conductive by ion implanting phosphorous.

Process 48: Polysilicon Ramped Anneal

When the polysilicon is deposited, it is substantially amorphous. In order to form the polysilicon to the desired tensile stress, it is annealed. The chip is heated for an extended period in a nitrogen ambient ($N_2$). The annealing step also drives the phosphorous dopant into the polysilicon as in a standard implant drive process. In the preferred embodiment, the polysilicon is annealed to result in a tensile stress of approximately 6E8 dynes/cm$^2$ in order to maintain a relatively stable spring constant for the finished microstructure. The resulting polysilicon sheet resistance is approximately 90 to 160 ohms/sq.

Figure 13:
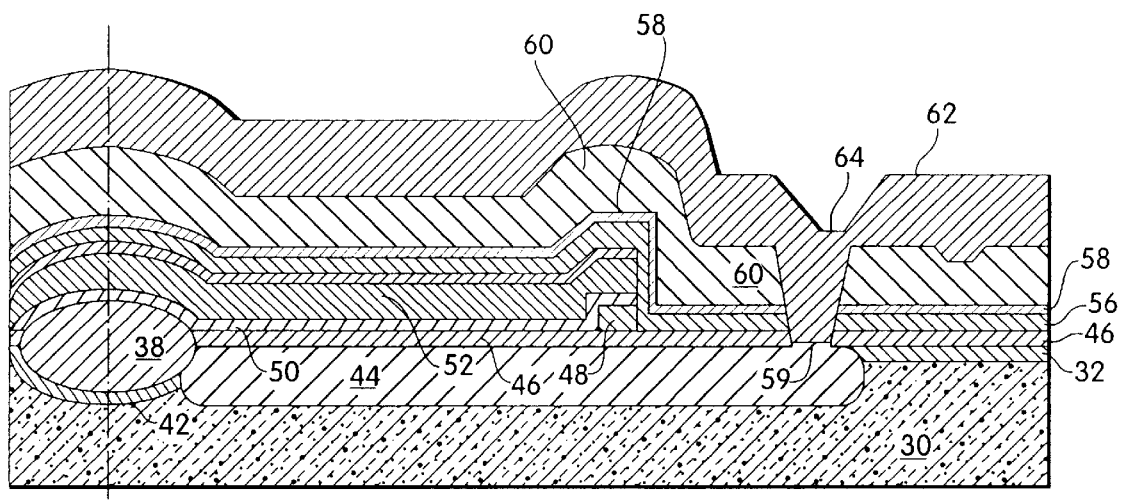
FIG. 13 is a cross-sectional view of the sensor region of the sensor region of an exemplary chip during an eleventh stage of the fabrication method of the present invention.

FIG. 13 shows the chip after completion of step 48. As shown therein, a 20,000 angstrom thick layer of polysilicon 62 has been deposited over the chip. As shown in FIG. 13, an anchor 64 is formed in anchor well 59.

Process 49: Microstructure Mask

Figure 14:
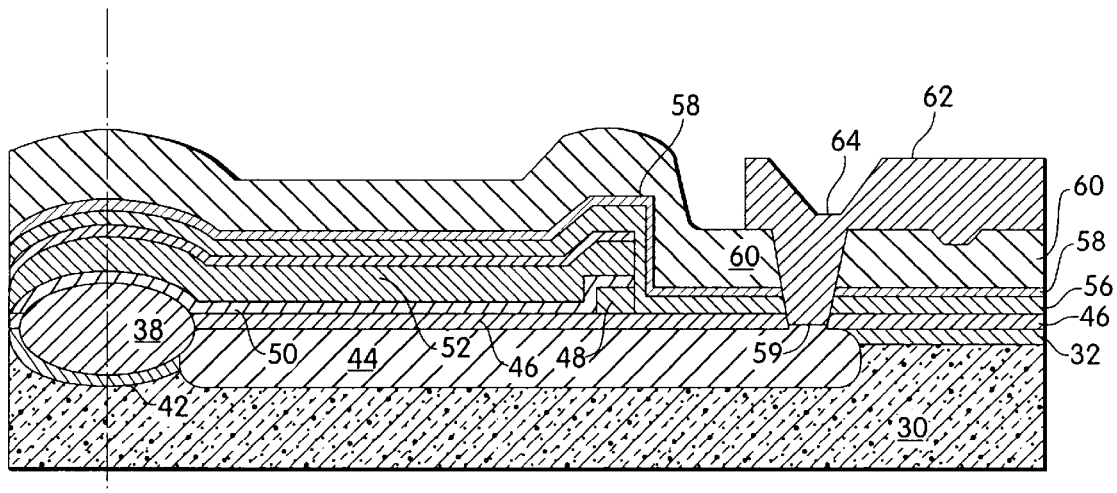
FIG. 14 is a cross-sectional view of the sensor region of the sensor region of an exemplary chip during a twelfth stage of the fabrication method of the present invention.

In this process, a photoresist mask is formed to remove all polysilicon from the circuit area and to form the desired microstructure shape in the moat area. The polysilicon is then dry etched. FIG. 14 illustrates the chip after the completion of process 49.

Task 13: Remove Spacer Oxide from Circuit Area

This task comprises only process 50.

Process 50: MOBE Mask

In this process, a photoresist layer is deposited and masked for etching the spacer oxide layer 60. The term "MOBE" is an arbitrary designation for this particular mask. The term "MOBE" is a contraction of "moat and beam" and was selected because this mask is formed so as to cover the microstructure (or beam) but to allow the spacer oxide 60 to be removed from the circuit area. The mask, different than the moat mask used in process 36. After the photoresist is patterned, the chip is deposited in the buffer oxide etch bath in which the spacer oxide is selectively etched away down to underlying nitride layer 58. The LPCVD nitride layer 58 acts as an etch stop for the etching of the oxide.

Figure 15:
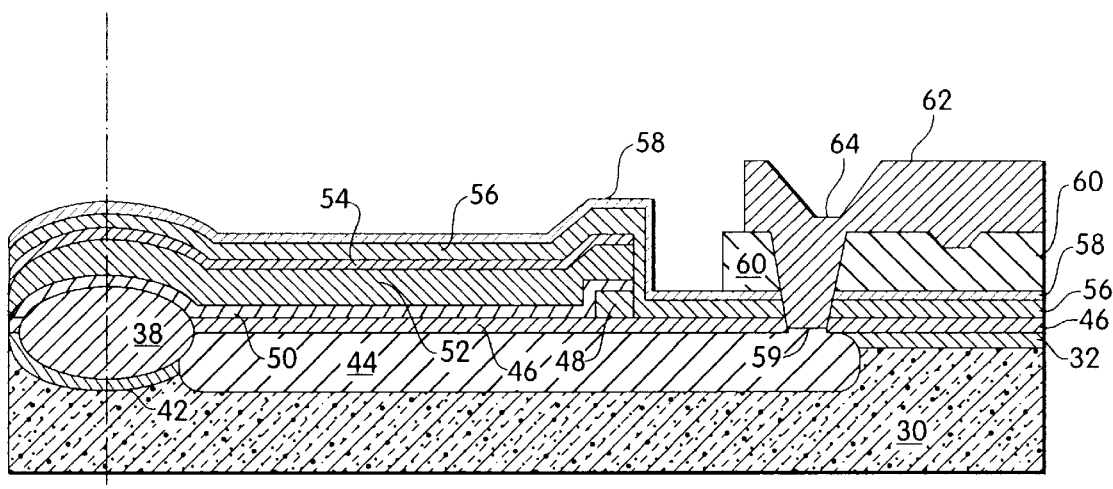
FIG. 15 is a cross-sectional view of the sensor region of the sensor region of an exemplary chip during a thirteenth stage of the fabrication method of the present invention.

FIG. 15 illustrates the chip subsequent to the completion of step 50.

Task 14: Deposit Oxide Layer to Protect Microstructure

This task comprises only a single process.

Process 51: Low Temperature Oxide Deposition

In this process, a 2,000 angstrom thick layer of low temperature oxide is deposited by chemical vapor deposition. This oxide layer will serve to protect the microstructure from an upcoming deposition of platinum for forming the electrical contacts in the circuit area as well as between the sensor and the circuitry. Without the thin layer of LTO, the platinum would react with the polysilicon during platinum silicidation and alter the polysilicon's mechanical and electrical properties.

Figure 16:
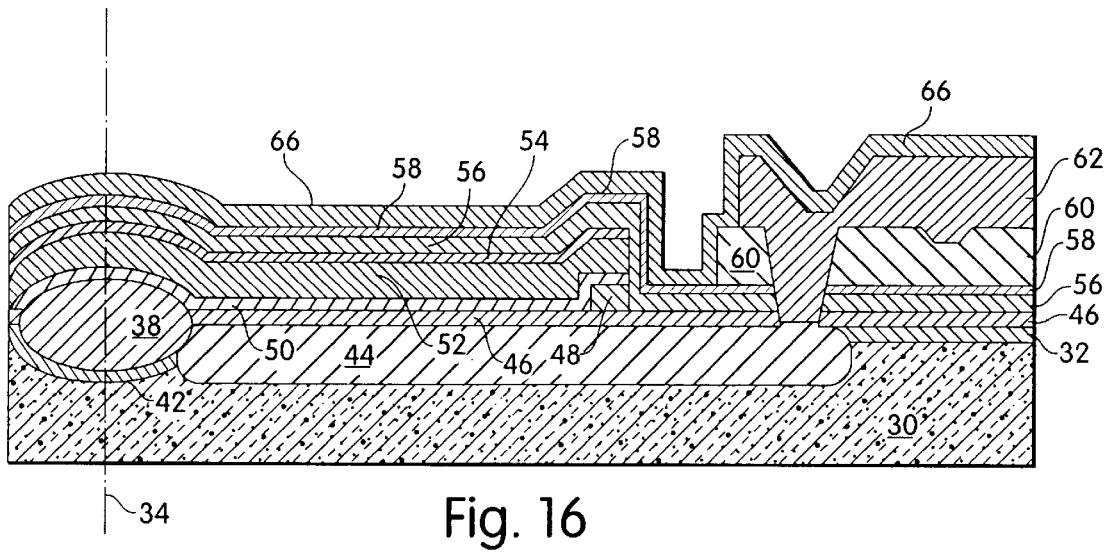
FIG. 16 is a cross-sectional view of the sensor region of the sensor region of an exemplary chip during a fourteenth stage of the fabrication method of the present invention.

FIG. 16 shows the 2,000 angstrom low temperature oxide layer at 66.

Task 15: Remove Sensor Dielectrics from Circuit Area

This task comprises only a single process.

Process 52: MOSIN Mask

A patterned photoresist layer is formed using standard photolithography steps to define a large island in the moat area where all sensor dielectrics will be preserved while the remainder of the photoresist is developed away so as to allow the etching away of all sensor dielectrics from the circuit area of the chip. Two masks are used here, a MOSIN mask and the MOBE mask, to provide extra photoresist protection on the sharp vertical steps of the polysilicon sensor. The term "MOSIN" was chosen to distinguish this mask from the MOAT mask and the MOBE mask. The term "MOSIN" is a contraction of "moat and silicon nitride" since the mask will be used to etch all the way down to nitride layer 54. In this process, the MOBE mask is used first followed by the MOSIN mask. The MOBE mask is slightly smaller than the MOSIN mask such that two photoresist patterns are visible. The sensor dielectrics which are etched away from the circuit area in this process comprise the low temperature oxide layer deposited in process 51, the nitride layer deposited in process 40 and the low temperature oxide layer deposited in process 38. The two oxide layers are removed by separate wet etch processes (buffer oxide etch). The nitride layer is removed in a dry plasma etch process. The nitride layer 54 underlying the three layers which are etched in this process that was deposited during process 35 remains. This layer, 54, serves as an etch stop for the etching of oxide layer 56. The three layers etched away in this process are removed in order to enable laser trimming in the circuit area. The photoresist is then removed after the three layers are etched.

Figure 17:
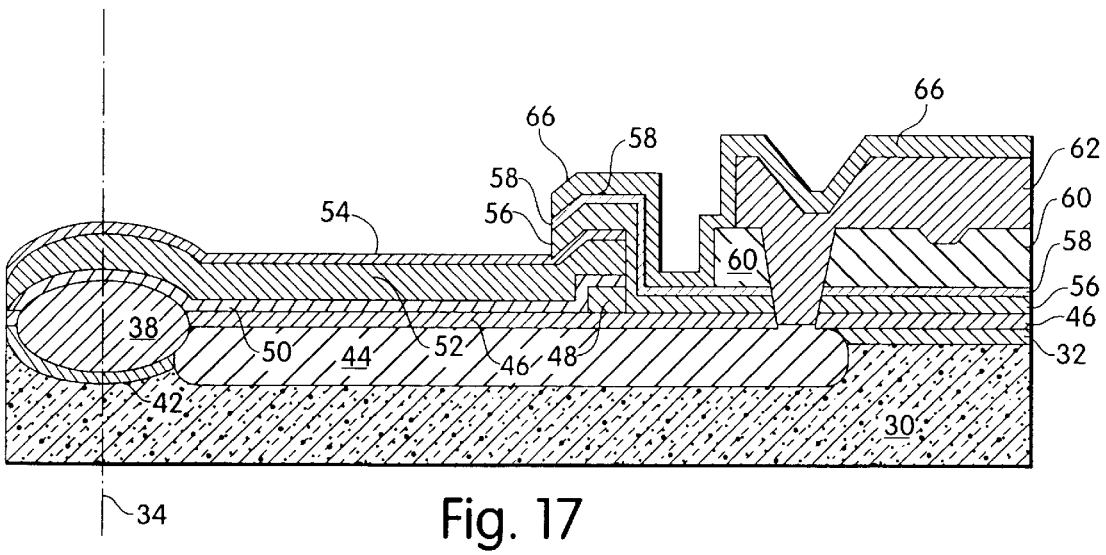
FIG. 17 is a cross-sectional view of the sensor region of the sensor region of an exemplary chip during a fifteenth stage of the fabrication method of the present invention.

FIG. 17 shows the chip after the completion of process 52. As shown therein, layers 66, 58 and 56 have been removed from the circuit area, thus exposing nitride layer 54.

Task 16: Contact Mask

This task comprises only process 53.

Process 53: Contact Mask

Like MOSIN mask in process 52, contact mask utilizes two separate photoresist layers (contact and MOBE) to provide sufficient photoresist coverage on the sharp vertical steps in the sensor area. First MOBE mask is applied to cover the moat area and leave the circuitry regions exposed. Then, contact mask is applied. The contact mask is developed to define openings to the transistors for metal contacts and openings to the n+ runners in the moat area for metal contacts and also to provide additional photoresist coverage for the microstructure in the moat area. After the photoresist masks have been formed, four layers must be etched through. They are nitride layer 54, BPSG layer 52, nitride layer 50 and gate oxide layer 46. All four layers are etched in a single long plasma etch which exposes the substrate in the defined contact areas such as the bare n+ runner in opening 67 in FIG. 19.

Figure 18:
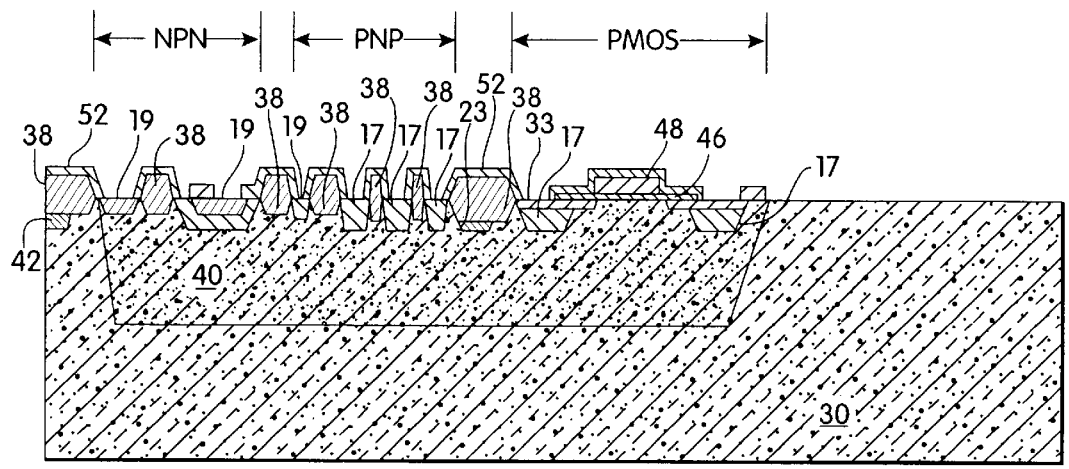
FIG. 18 is a cross-sectional view of the circuit region of an exemplary chip during a sixteenth stage of the fabrication method of the present invention.

FIG. 18 illustrates the circuit region of the chip after the completion of process 53. Reference numeral 48 indicates the gate polysilicon. Reference numeral 46 indicates the gate oxide. The shallow source and drain diffusion regions of the PMOS transistors are shown at 33. The BPSG layer is shown at 52. The remaining numerals refer to regions previously discussed with respect to at least FIG. 5 and have been defined in the discussion of FIG. 5.

Task 17: Form Platinum Silicide in Contact Areas

This task comprises processes 54–56. The purpose of this task is to form a platinum silicide layer in the metal contact openings, e.g., opening 67 in FIG. 19, so as to provide good ohmic contact with the electrical leads which will be formed in subsequent processes.

Process 54: Platinum Deposit

In this process, platinum is deposited on the chip by a standard high-vacuum sputtering process. The platinum is deposited to a depth of 400 angstroms.

Process 55: Platinum Sinter

The platinum formed in process 54 is sintered in this process so as to cause the platinum to react with the silicon on the surface of the substrate to form platinum silicide. The process essentially comprises exposing the chip to a high temperature. The platinum silicidizes only where it contacts the bare substrate, e.g., in the contact openings.

Process 56: Platinum Strip

In this process, the platinum which has not been silicidized is removed. Specifically, the chip is placed in a nitric-HCL acid bath which strips away unsilicidized platinum leaving platinum silicide in the contact openings.

Figure 19:
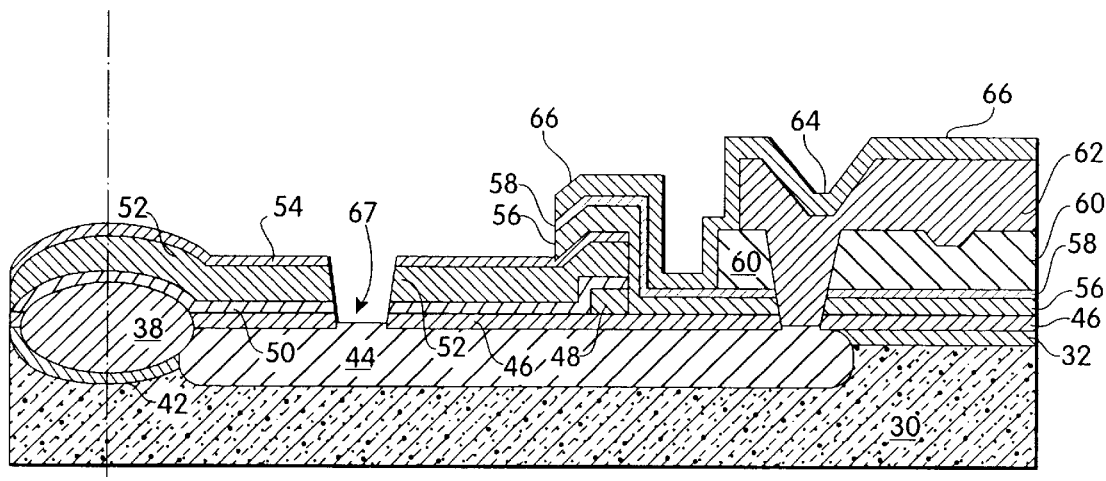
FIG. 19 is a cross-sectional view of the sensor region of the sensor region of an exemplary chip during a seventeenth stage of the fabrication method of the present invention.

FIG. 19 shows the chip after the completion of process 56 illustrating silicidized contact opening 67.

Task 18: Metallization

The metallization task comprises processes 57–61. In this task, the metal leads are formed to connect the various contact openings to each other so as to couple the transistors together in the desired circuit pattern. The thin film trimmable resistors also are formed.

Process 57: SiCr Sputter

In this process, a blanket of SiCr is formed by a standard sputter deposition process. The SiCr will be used to form laser trimmable resistors. The SiCr is deposited to a sheet resistance of 1,000–1,200 ohms/sq.

Process 58: Metal Sputter

In this process, titanium tungsten (TiW) and aluminum/copper (AlCu) are deposited in two separate sputtering processes. The two metals will be formed into the electric leads in the following process.

Process 59: Metal Mask

In this process, a photoresist mask is formed defining the desired metal leads. Two consecutive exposures are required with two different masks to insure complete removal of the photoresist (and ultimately the metal) from the two micrometer deep sensor gaps. The first mask exposed is a standard metal mask to connect the BIMOS circuitry on the chip. Then, a moat mask is exposed in the same resist to facilitate removal of all resist from the sensor area during development. Only the sensor area is opened by moat mask so only the sensor area gets over exposed. The AlCu is then etched by a wet etch process in a bath of phosphoric acetic nitric (PAN) acid. This is followed by a wet etch of the TiW in hydrogen peroxide leaving the desired electrical leads. The photoresist is then stripped away.

Process 60: Thin Film Mask

Photoresist is deposited and patterned to define the desired resistors. The SiCr layer is dry etched in accordance with the photoresist mask to form the resistors. The photoresist is then stripped away.

Thin film mask, like the metal mask in process 59, uses a second exposure with moat mask to facilitate clearing the sensor area of photoresist and, therefore, thin film material also.

Process 61: Alloy

In this process, the chip is exposed in a high temperature furnace to cause the TiW and AlCu to react with the platinum silicide in the contact openings so as to form good ohmic contact between the substrate and the electrical leads.

Figure 20:
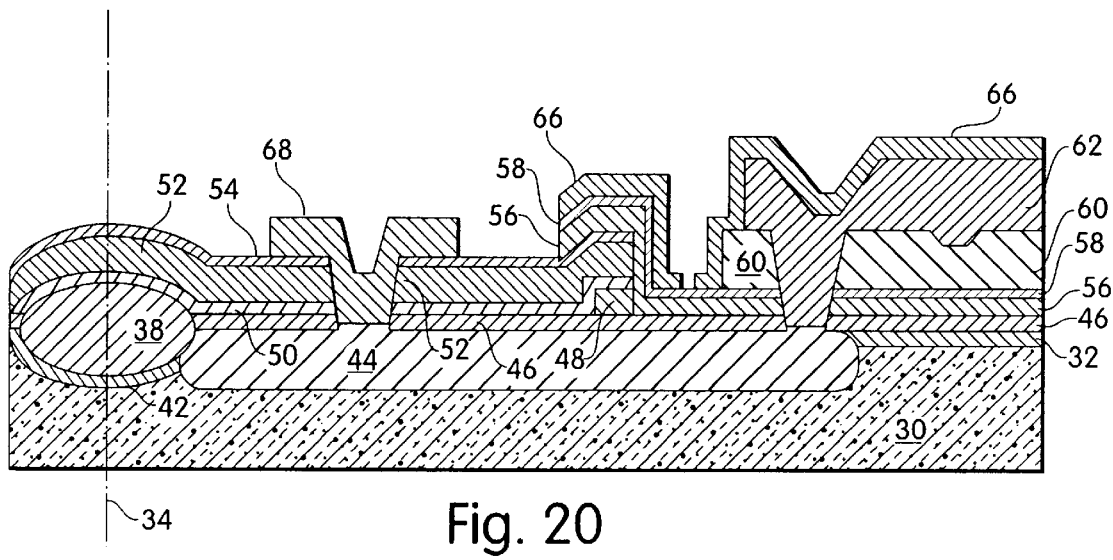
FIG. 20 is a cross-sectional view of the sensor region of the sensor region of an exemplary chip during an eighteenth stage of the fabrication method of the present invention.

FIG. 20 illustrates the circuit after the completion of process 61. As shown therein, metal leads, such as lead 68, have been formed in contact openings such as opening 67. The leads extend over nitride layer 54 to connect the contact openings, thus coupling the transistors into the desired circuit.

Task 19: Passivation

This task comprises processes 62–66. The passivation used in the method of this invention is deposited in two separate steps to allow a nitride-to-nitride seal to be formed around the sensor to protect the circuitry from the very long etching process which will follow to completely undercut the spacer LTO and release the sensor. The passivation layers will serve to protect the metal from scratching and also to protect the circuitry from moisture, ionic contamination, etc. The passivation, however, cannot exist in the bond pad openings because metal must be bonded to the bond pads. The passivation also must be removed from the microstructure so as not to affect its free movement under accelerative forces.

Process 62: Plasma Oxide Deposit

In this process, plasma oxide is deposited to a thickness of 5,000 angstroms by plasma enhanced chemical vapor deposition. A small amount of phosphorous is contained in the oxygen plasma so as to form part of the oxide layer.

Process 63: Passivation Mask

In this process, the oxide layer formed in process 62 is patterned to set up the nitride-to-nitride seal around the perimeter of the sensor and also to open up the circuit area bond pads. Accordingly, a photoresist mask is formed and patterned to define (1) a channel around the perimeter of the sensor and (2) the bond pads. The oxide layer is etched in a buffer oxide etch bath and the photoresist is then stripped away.

Figure 21:
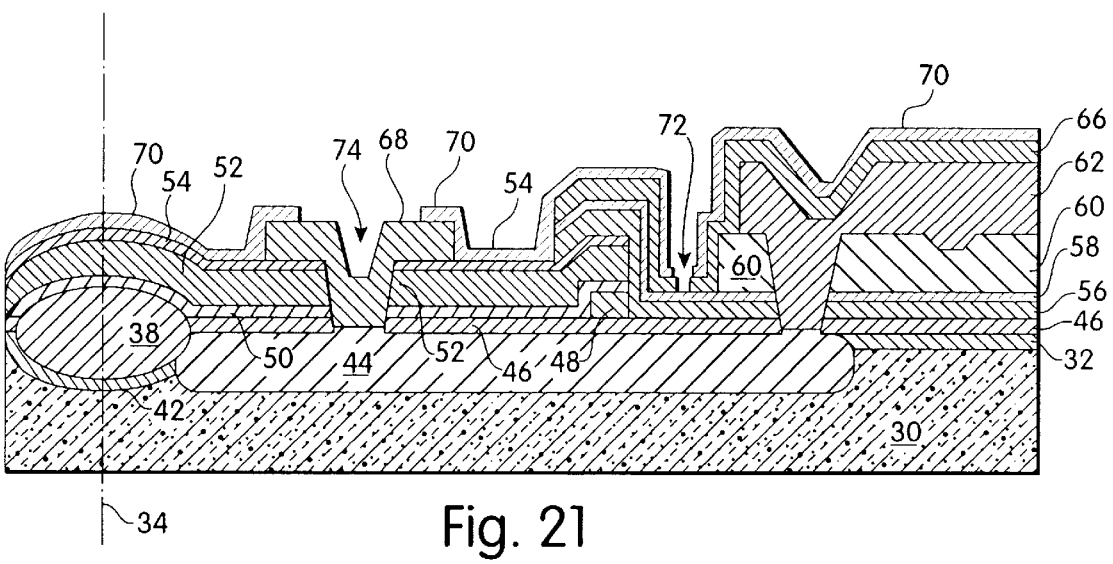
FIG. 21 is a cross-sectional view of the sensor region of the sensor region of an exemplary chip during a nineteenth stage of the fabrication method of the present invention.

FIG. 21 illustrates the chip subsequent to the completion of process 63. As shown therein, a plasma oxide layer 70 has been formed over the chip and layer 70 has been etched to define openings such as sensor perimeter opening 72 and bond pad opening 74.

Process 64: Plasma Nitride Deposit

At this point, another layer of nitride 76 is deposited to a thickness of approximately 5,000 angstroms by plasma enhanced chemical vapor deposition. This sets up a nitride-to-nitride seal around the sensor area. The nitride-to-nitride seal protects the circuit area from the final long wet etch used to remove the spacer LTO from under the polysilicon sensor. The seal is formed between this nitride layer 76 (see FIG. 22) and the LPCVD nitride layer 58 that was deposited in process 40.

Process 65: Back Etch

This is a standard process and is not actually related to the nitride-to-nitride seal task 19. However, it is performed at this point, i.e., before the nitride layer deposited in process 64 is removed, because the nitride layer adds extra protection during the back etch. In any event, the back etch involves blanket coating the front of the chip with photoresist and etching all dielectrics from the back of the chip in a long series of wet and dry etches.

Process 66: NTPAS Mask

It is now necessary to remove the nitride deposited in process 64 from the sensor area as well as from the bond pads, e.g., bond pad 74. A photoresist mask is formed to open the bond pads and the sensor. The nitride layer 76 is etched in a dry etching process. As noted above, this etching process is performed after the back etch because the nitride layer provides added protection during the back etch.

Figure 22:
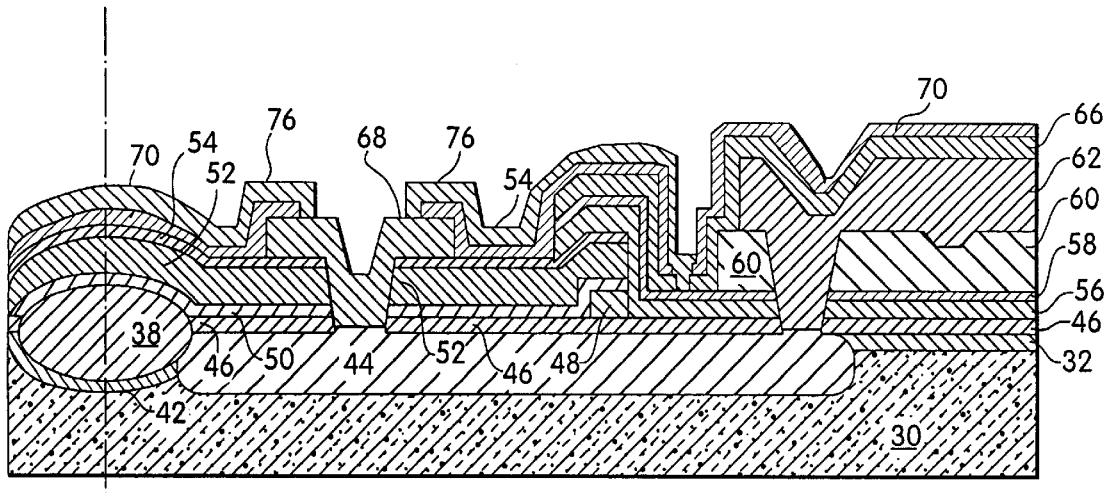
FIG. 22 is a cross-sectional view of the sensor region of the sensor region of an exemplary chip during a twentieth stage of the fabrication method of the present invention.
Figure 23:
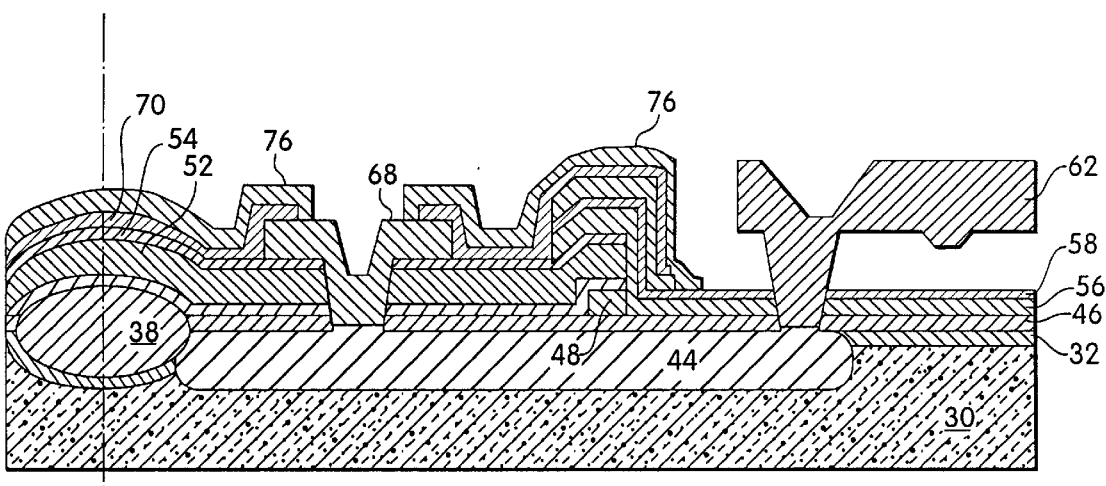
FIG. 23 is a cross-sectional view of the sensor region of the sensor region of an exemplary chip during a twenty-first stage of the fabrication method of the present invention.

FIG. 22 illustrates the chip after the completion of process 66. As shown therein, a nitride layer 76 has been formed over the chip and has been etched to open up the metal leads in the bond pad regions such as lead 68 and to open up the sensor.

Task 20: Release Microstructure

This final task comprises only process 67 in which the spacer oxide layer is removed, thus releasing the microstructure into its final suspended condition as illustrated in FIGS. 1A, 1B and 2A.

Process 67: Microstructure Release Mask

In this process, a photoresist mask is formed to entirely cover the circuitry area and most of the moat area with a few holes in the moat area adjacent to sections where the spacer oxide is exposed, i.e., sections where the polysilicon has been removed to form the microstructure shape. The holes in the photoresist are placed such that they are directly adjacent to the edges of the overlying microstructure.

The chip is then placed in a buffered etch oxide bath such that the oxide layer is etched where it is exposed under the photoresist mask. The chip is left in the bath for an extended period such that the oxide is etched slightly beyond the dimensions of the hole in the photoresist and extend a few microns beneath the edges of the microstructure.

The photoresist is then removed and another layer of photoresist is deposited on the chip. This layer of photoresist fills in the holes now formed in the oxide layer as well as fills in the voids between portions of the etched polysilicon microstructure. The photoresist is then exposed without a mask to develop away most of the photoresist. However, the portions of the photoresist which have filled in the edges of the holes and which extend under the edges of the microstructure are not developed away because these edges are occluded by the polysilicon microstructure. If desired, a mask can be used so as also to leave some photoresist bridges in polysilicon layer 62 in the gaps between non-contacting portions of the polysilicon microstructure, e.g., between mobile arms 14.

The remaining spacer oxide 60 is then removed in a buffer oxide etch. This bath also removes oxide layers 66 and 70 which were earlier left in the moat area coating the microstructure. The buffered oxide bath does not affect the polysilicon or the photoresist. Accordingly, the photoresist bridges in the gaps between non-contacting portions of the microstructure as well as the photoresist pedestals formed underneath the microstructure still remain after the spacer oxide is removed. The photoresist pedestals which formed at the edges of the holes beneath the microstructure vertically support the microstructure preventing it from bending and contacting the underlying substrate. The photoresist bridges left in the gaps between non-contacting portions of the microstructure provide lateral support preventing such portions from laterally bending and contacting each other.

Without the photoresist pedestals and bridges, portions of the microstructure would be extremely prone to bending and contacting the substrate and/or other portions of the microstructure during the drying procedure after the buffer oxide wet etch due to liquid surface tension effects. The photoresist pedestals and bridges significantly reduce the possibility of portions of the microstructure contacting the substrate or other portions of the microstructure. Further, even if contact occurs, the bumps formed on the bottom surface of the microstructure during process 43 significantly reduce surface area contact thus significantly reducing the possibility of sticking. Accordingly, the photoresist pedestals and bridges as well as the bumps significantly increase the device yield of the method of the present invention.

The photoresist pedestals and bridges are removed in a long oxygen plasma stripping process which does not present any liquid surface tension problems.

Process 67 of the present invention is more fully discussed in U.S. patent application Ser. No. 07/872,037 referenced above. Accordingly, it will only be briefly discussed here. For a more complete understanding of this process and its many steps, reference should be made to the aforementioned patent application.

At this point, the microstructure is now suspended in its final form as illustrated in FIG. 20.

It should be understood that the method of the present invention can be readily adapted for circuitry having NMOS transistors in addition to the PMOS and bipolar transistors discussed in the preferred embodiment disclosed herein. It should further be understood that the method of the present invention can be used to fabricate many kinds of chips embodying a microstructure as well as circuitry and is not limited to the accelerometer discussed herein.

Having thus described a few particular embodiments of the invention, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A monolithic sensor comprising:

a semiconductor substrate;

a microstructure disposed above said substrate, said microstructure including a plurality of posts extending from a surface of said substrate and a silicon bridge suspended above said substrate by said posts, said bridge including a central beam and a plurality of generally parallel movable fingers extending transversely from said beam, said movable fingers being movable from a predetermined position relative to said substrate;

a plurality of generally parallel substantially stationary fingers anchored to said substrate, each of said substantially stationary fingers corresponding to one of said movable fingers and positioned adjacent and parallel to said corresponding movable finger such that said movable finger and said corresponding substantially stationary finger form first and second plates of a capacitor; and circuitry for generating a signal based on movement of said movable fingers from the predetermined position, said circuitry being coupled to the said movable fingers and said substantially stationary fingers.

2. A monolithic sensor as defined in claim 1 wherein said movable fingers are transversely movable with respect to the surface of said substrate.

3. A monolithic micromechanical apparatus comprising:

a semiconductor substrate including a surface;

a microstructure disposed above said substrate, said microstructure including a plurality of posts extending from the surface of said substrate and a bridge suspended from said substrate by said posts, said bridge including a central beam and a plurality of generally parallel movable fingers extending transversely from said beam;

a plurality of generally parallel electrically conductive substantially stationary fingers anchored to said substrate, each of said substantially stationary fingers corresponding to one of said movable fingers and positioned relative to said corresponding movable finger such that said movable finger and said corresponding substantially stationary finger form a capacitor, with movement of said movable fingers relative to said substantially stationary fingers altering the capacitance between each of said movable fingers and said corresponding substantially stationary finger; and circuitry disposed on said substrate and operationally coupled to said movable fingers and said substantially stationary fingers for processing a signal based on a relative positioning of said movable fingers and said substantially stationary fingers.

4. A monolithic micromechanical apparatus as defined in claim 3 wherein said movable fingers are transversely movable with respect to the surface of said substrate.

5. A monolithic capacitance-type micromechanical device comprising:

a semiconductor substrate including a surface;

a microstructure disposed above said substrate, said microstructure including a plurality of posts extending from the surface of said substrate and a bridge suspended from said substrate by said posts, said bridge including a central beam and a plurality of generally parallel movable fingers extending transversely from said beam; and a plurality of generally parallel electrically conductive substantially stationary fingers anchored to said substrate, each of said substantially stationary fingers corresponding to one of said movable fingers and positioned relative to said corresponding movable finger such that said movable finger and said corresponding substantially stationary finger form a capacitor.

6. A monolithic capacitance-type micromechanical device as defined in claim 5 wherein said movable fingers are transversely movable with respect to the surface of said substrate.

7. A capacitance-type micromechanical device comprising:

a semiconductor substrate including a surface;

a microstructure disposed above said substrate, said microstructure including a plurality of posts extending from the surface of said substrate and a bridge suspended from said substrate by said posts, said bridge including a central beam and a plurality of generally parallel movable fingers extending transversely from said beam; and a plurality of generally parallel electrically conductive substantially stationary fingers anchored to said substrate, each of said substantially stationary fingers corresponding to one of said movable fingers and positioned relative to said corresponding movable finger such that said movable finger and said corresponding substantially stationary finger form a capacitor.

8. A capacitance-type micromechanical device as defined in claim 7 wherein said movable fingers are transversely movable with respect to the surface of said substrate.

* * * * *